US010553750B2

(12) United States Patent
Liu et al.

(10) Patent No.: US 10,553,750 B2
(45) Date of Patent: *Feb. 4, 2020

(54) SEMICONDUCTOR NANOCRYSTALS, METHODS FOR MAKING SAME, COMPOSITIONS, AND PRODUCTS

(71) Applicant: SAMSUNG ELECTRONICS CO., LTD., Suwon-si (KR)

(72) Inventors: Wenhao Liu, Billerica, MA (US); Craig Breen, Somerville, MA (US); Seth Coe-Sullivan, Redondo Beach, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/287,830

(22) Filed: Feb. 27, 2019

(65) Prior Publication Data

US 2019/0198710 A1 Jun. 27, 2019

Related U.S. Application Data

(63) Continuation of application No. 14/451,125, filed on Aug. 4, 2014, now Pat. No. 10,236,410, which is a (Continued)

(51) Int. Cl.
*H01L 33/06* (2010.01)
*C09D 11/52* (2014.01)
(Continued)

(52) U.S. Cl.
CPC .............. *H01L 33/06* (2013.01); *C09D 11/52* (2013.01); *C09K 11/02* (2013.01); *C09K 11/565* (2013.01);
(Continued)

(58) Field of Classification Search
CPC ........... H01L 21/02601; H01L 31/0352; H01L 31/036; H01L 31/06; G09K 11/56;
(Continued)

(56) References Cited

U.S. PATENT DOCUMENTS 3,760,000 A  9/1973 Curry
6,207,229 B1 3/2001 Bawendi et al.
(Continued)

FOREIGN PATENT DOCUMENTS

CN  101294071 A  10/2008
CN  102017147 A  4/2011
(Continued)

OTHER PUBLICATIONS

Notice of Allowance—Korean Patent Application No. 10-2014-7025221 dated Jan. 25, 2019, citing references listed within.
(Continued)

*Primary Examiner* — David C Spalla
(74) *Attorney, Agent, or Firm* — Cantor Colburn LLP

(57) ABSTRACT

A semiconductor nanocrystal characterized by having a solid state photoluminescence external quantum efficiency at a temperature of 90° C. or above that is at least 95% of the solid state photoluminescence external quantum efficiency of the semiconductor nanocrystal at 25° C. is disclosed. A semiconductor nanocrystal having a multiple LO phonon assisted charge thermal escape activation energy of at least 0.5 eV is also disclosed. A semiconductor nanocrystal capable of emitting light with a maximum peak emission at a wavelength in a range from 590 nm to 650 nm characterized by an absorption spectrum, wherein the absorption ratio of OD at 325 nm to OD at 450 nm is greater than 5.5. A semiconductor nanocrystal capable of emitting light with a maximum peak emission at a wavelength in a range from
(Continued)

545 nm to 590 nm characterized by an absorption spectrum, wherein the absorption ratio of OD at 325 nm to OD at 450 nm is greater than 7. A semiconductor nanocrystal capable of emitting light with a maximum peak emission at a wavelength in a range from 495 nm to 545 nm characterized by an absorption spectrum, wherein the absorption ratio of OD at 325 nm to OD at 450 nm is greater than 10. A composition comprising a plurality of semiconductor nanocrystals wherein the solid state photoluminescence efficiency of the composition at a temperature of 90° C. or above is at least 95% of the solid state photoluminescence efficiency of the composition 25° C. is further disclosed. A method for preparing semiconductor nanocrystals comprises introducing one or more first shell chalcogenide precursors and one or more first shell metal precursors to a reaction mixture including semiconductor nanocrystal cores, wherein the first shell chalcogenide precursors are added in an amount greater than the first shell metal precursors by a factor of at least about 2 molar equivalents and reacting the first shell precursors at a first reaction temperature of at least 300° C. to form a first shell on the semiconductor nanocrystal cores. Populations, compositions, components and other products including semiconductor nanocrystals of the invention are disclosed. Populations, compositions, components and other products including semiconductor nanocrystals made in accordance with any method of the invention is also disclosed.

14 Claims, 9 Drawing Sheets

Related U.S. Application Data continuation of application No. PCT/US2012/066154, filed on Nov. 20, 2012.

(60) Provisional application No. 61/595,116, filed on Feb. 5, 2012, provisional application No. 61/678,902, filed on Aug. 2, 2012.

(51) Int. Cl.
C09K 11/02 (2006.01)
C09K 11/56 (2006.01)
C09K 11/86 (2006.01)
H01L 33/00 (2010.01)
H01L 33/28 (2010.01)
C09K 11/88 (2006.01)
H01L 33/50 (2010.01)
B82Y 20/00 (2011.01)

(52) U.S. Cl.
CPC ........ C09K 11/883 (2013.01); H01L 33/0029 (2013.01); H01L 33/28 (2013.01); B82Y 20/00 (2013.01); H01L 33/502 (2013.01); Y10S 977/774 (2013.01)

(58) Field of Classification Search
CPC ............... G09K 11/565; G09K 11/703; G09K 11/7414; G09K 11/883
See application file for complete search history.

(56) References Cited

U.S. PATENT DOCUMENTS

| | | |
|---|---|---|
| 6,322,901 B1 | 11/2001 | Bawendi et al. |
| 6,600,175 B1 | 7/2003 | Baretz et al. |
| 6,607,829 B1 | 8/2003 | Bawendi |
| 6,608,332 B2 | 8/2003 | Shimizu et al. |
| 6,815,064 B2 | 11/2004 | Treadway et al. |
| 6,872,249 B2 | 3/2005 | Peng et al. |
| 7,147,712 B2 | 12/2006 | Zehnder et al. |
| 7,229,497 B2 | 6/2007 | Stott et al. |
| 7,267,810 B2 | 9/2007 | Yu et al. |
| 7,476,599 B2 | 1/2009 | Wang et al. |
| 7,482,059 B2 | 1/2009 | Peng et al. |
| 7,557,028 B1 | 7/2009 | Scher et al. |
| 7,615,800 B2 | 11/2009 | Kahen |
| 7,767,260 B2 | 8/2010 | Peng et al. |
| 7,777,233 B2 | 8/2010 | Kahen et al. |
| 7,824,731 B2 | 11/2010 | Ying et al. |
| 7,855,091 B1 | 12/2010 | Kar et al. |
| 7,919,012 B2 * | 4/2011 | Peng ..................... B82Y 15/00 252/301.6 S |
| 7,964,278 B2 * | 6/2011 | Banin ..................... B82Y 20/00 257/103 |
| 8,088,483 B1 | 1/2012 | Whiteford et al. |
| 8,354,785 B2 | 1/2013 | Clough et al. |
| 8,377,333 B2 | 2/2013 | Ramprasad et al. |
| 8,404,154 B2 | 3/2013 | Breen et al. |
| 8,643,064 B2 | 2/2014 | Tian et al. |
| 8,691,114 B2 | 4/2014 | Ramprasad et al. |
| 8,718,437 B2 | 5/2014 | Coe-Sullivan et al. |
| 8,847,201 B2 | 9/2014 | Char et al. |
| 8,876,272 B2 | 11/2014 | Linton et al. |
| 8,906,265 B2 | 12/2014 | Breen et al. |
| 8,980,133 B2 | 3/2015 | Ramprasad |
| 9,054,329 B2 | 6/2015 | Coe-Sullivan et al. |
| 9,136,428 B2 | 9/2015 | Clough et al. |
| 9,139,435 B2 | 9/2015 | Breen et al. |
| 9,196,781 B2 | 11/2015 | Tian et al. |
| 10,236,410 B2 * | 3/2019 | Liu .......... C09K 11/02 |
| 2002/0106849 A1 | 8/2002 | Moore |
| 2003/0097976 A1 | 5/2003 | Zehnder et al. |
| 2003/0145770 A1 | 8/2003 | Reinikainen |
| 2003/0145779 A1 | 8/2003 | Alivisatos et al. |
| 2003/0186914 A1 | 10/2003 | Hofer et al. |
| 2003/0227116 A1 | 12/2003 | Halik et al. |
| 2004/0110002 A1 | 6/2004 | Kim et al. |
| 2004/0178390 A1 | 9/2004 | Whiteford et al. |
| 2006/0110279 A1 | 5/2006 | Hau et al. |
| 2006/0157720 A1 | 7/2006 | Bawendi et al. |
| 2006/0170331 A1 | 8/2006 | Bertram et al. |
| 2007/0059527 A1 | 3/2007 | Jun et al. |
| 2007/0104865 A1 | 5/2007 | Pickett |
| 2007/0128439 A1 | 6/2007 | Kim et al. |
| 2007/0170418 A1 | 7/2007 | Bowers et al. |
| 2007/0201056 A1 | 8/2007 | Cok et al. |
| 2007/0295266 A1 | 12/2007 | Lee et al. |
| 2008/0012031 A1 | 1/2008 | Jang et al. |
| 2008/0084706 A1 | 4/2008 | Roshan et al. |
| 2008/0099728 A1 | 5/2008 | Jin et al. |
| 2008/0118755 A1 | 5/2008 | Whiteford et al. |
| 2008/0160306 A1 | 7/2008 | Mushtaq et al. |
| 2008/0188063 A1 | 8/2008 | Alivisatos et al. |
| 2008/0202383 A1 | 8/2008 | Shi |
| 2008/0207581 A1 | 8/2008 | Whiteford et al. |
| 2008/0220593 A1 | 9/2008 | Pickett et al. |
| 2008/0228755 A1 | 9/2008 | Haga et al. |
| 2008/0252209 A1 | 10/2008 | Jang et al. |
| 2008/0264473 A1 | 10/2008 | Cumpston et al. |
| 2008/0268248 A1 | 10/2008 | Jang et al. |
| 2008/0296144 A1 | 12/2008 | Strouse et al. |
| 2008/0316576 A1 | 12/2008 | Molenkamp et al. |
| 2009/0073349 A1 | 3/2009 | Park et al. |
| 2009/0162011 A1 | 6/2009 | Coe-Sullivan et al. |
| 2009/0181478 A1 * | 7/2009 | Cox ..................... B82Y 20/00 438/22 |
| 2009/0203196 A1 | 8/2009 | Kim et al. |
| 2009/0217970 A1 | 9/2009 | Zimmerman et al. |
| 2009/0230382 A1 | 9/2009 | Banin |
| 2009/0278141 A1 | 11/2009 | Coe-Sullivan et al. |
| 2009/0302304 A1 | 12/2009 | Peng et al. |
| 2010/0009338 A1 | 1/2010 | Zhang et al. |
| 2010/0052512 A1 | 3/2010 | Clough et al. |
| 2010/0062154 A1 | 3/2010 | Shin et al. |
| 2010/0090164 A1 | 4/2010 | Peng et al. |

(56) References Cited

U.S. PATENT DOCUMENTS

| | | |
|---|---|---|
| 2010/0108530 A1 | 5/2010 | Zehnder et al. |
| 2010/0140586 A1 | 6/2010 | Char et al. |
| 2010/0159248 A1 | 6/2010 | Jang et al. |
| 2010/0163800 A1 | 7/2010 | Peng et al. |
| 2010/0226849 A1 | 9/2010 | Peng |
| 2010/0258789 A1 | 10/2010 | Akai et al. |
| 2010/0264371 A1 | 10/2010 | Nick |
| 2010/0265307 A1 | 10/2010 | Linton et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas |
| 2010/0289003 A1 | 11/2010 | Kahen et al. |
| 2010/0289044 A1 | 11/2010 | Krames et al. |
| 2010/0308272 A1* | 12/2010 | Peng .................. B82Y 15/00 252/301.6 S |
| 2011/0006285 A1 | 1/2011 | Lifshitz et al. |
| 2011/0031452 A1 | 2/2011 | Krauss et al. |
| 2011/0049442 A1 | 3/2011 | Schreuder et al. |
| 2011/0080090 A1 | 4/2011 | Wood et al. |
| 2011/0081538 A1 | 4/2011 | Linton |
| 2011/0052918 A1 | 5/2011 | Krauss et al. |
| 2011/0101240 A1 | 5/2011 | Barbera-Guillem |
| 2011/0103055 A1 | 5/2011 | Carroll |
| 2011/0103064 A1 | 5/2011 | Coe-Sullivan et al. |
| 2011/0129420 A1 | 6/2011 | Allen et al. |
| 2011/0175030 A1 | 7/2011 | Ren et al. |
| 2011/0186811 A1 | 8/2011 | Coe-Sullivan et al. |
| 2011/0212561 A1 | 9/2011 | Banin et al. |
| 2011/0220194 A1 | 9/2011 | Kurtin et al. |
| 2011/0220844 A1 | 9/2011 | Tulsky et al. |
| 2011/0223110 A1 | 9/2011 | Bartel et al. |
| 2011/0223425 A1 | 9/2011 | Schreuder et al. |
| 2011/0226991 A1 | 9/2011 | Treadway et al. |
| 2011/0229397 A1 | 9/2011 | Bartel et al. |
| 2011/0233468 A1 | 9/2011 | Zong et al. |
| 2011/0245533 A1 | 10/2011 | Breen et al. |
| 2011/0260111 A1 | 10/2011 | Nie et al. |
| 2011/0262752 A1 | 10/2011 | Bawendi et al. |
| 2011/0278536 A1 | 11/2011 | Walker et al. |
| 2011/0309238 A1 | 12/2011 | Tian et al. |
| 2011/0309325 A1 | 12/2011 | Park et al. |
| 2012/0018675 A1 | 1/2012 | Okuyama et al. |
| 2012/0049119 A1 | 3/2012 | Greytak et al. |
| 2012/0113671 A1 | 5/2012 | Sadasivan et al. |
| 2012/0175588 A1 | 7/2012 | Qiao et al. |
| 2012/0187367 A1 | 7/2012 | Modi et al. |
| 2012/0189791 A1 | 7/2012 | Modi et al. |
| 2012/0250351 A1 | 10/2012 | Shin et al. |
| 2012/0256141 A1 | 10/2012 | Nick et al. |
| 2012/0286238 A1 | 11/2012 | Linton et al. |
| 2012/0313075 A1 | 12/2012 | Linton et al. |
| 2013/0026506 A1* | 1/2013 | Arbell .................. C09K 11/02 257/88 |
| 2013/0048946 A1 | 2/2013 | Jang et al. |
| 2013/0069018 A1 | 3/2013 | Zhu et al. |
| 2013/0092886 A1 | 4/2013 | Kahen et al. |
| 2013/0148376 A1* | 6/2013 | Nick .................. G02B 6/0001 362/559 |
| 2013/0169904 A1 | 7/2013 | Kang et al. |
| 2013/0175514 A1 | 7/2013 | Han et al. |
| 2013/0240787 A1 | 9/2013 | Chen et al. |
| 2013/0273247 A1 | 10/2013 | Kamplain et al. |
| 2014/0001436 A1 | 1/2014 | Welch et al. |
| 2014/0049155 A1 | 2/2014 | Kurtin |
| 2014/0175591 A1 | 6/2014 | Tian et al. |
| 2014/0198142 A1 | 7/2014 | Whitehead et al. |
| 2014/0227862 A1 | 8/2014 | Song et al. |
| 2014/0284549 A1 | 9/2014 | Liu et al. |
| 2014/0312300 A1 | 10/2014 | Ramprasad et al. |
| 2014/0322901 A1 | 10/2014 | Huang et al. |
| 2014/0334181 A1 | 11/2014 | Hu et al. |
| 2015/0003043 A1 | 1/2015 | Ke |
| 2015/0013589 A1 | 1/2015 | Liu et al. |
| 2015/0014586 A1 | 1/2015 | Liu et al. |
| 2015/0014629 A1 | 1/2015 | Breen et al. |
| 2015/0021521 A1 | 1/2015 | Nick et al. |
| 2015/0021548 A1 | 1/2015 | Liu et al. |
| 2015/0021551 A1 | 1/2015 | Breen et al. |
| 2015/0152324 A1 | 6/2015 | Breen et al. |
| 2015/0166341 A1 | 6/2015 | Hamilton et al. |
| 2015/0171268 A1 | 6/2015 | Breen et al. |
| 2015/0184074 A1 | 7/2015 | Breen et al. |
| 2016/0155882 A1 | 6/2016 | Tian et al. |

FOREIGN PATENT DOCUMENTS

| | | |
|---|---|---|
| KR | 20070029915 A | 3/2007 |
| KR | 1020080027642 | 3/2008 |
| TW | 200918449 A | 5/2009 |
| WO | WO2008/063658 A2 | 5/2008 |
| WO | WO2009014590 A2 | 1/2009 |
| WO | WO2009/120688 A1 | 10/2009 |
| WO | WO2009137053 A1 | 12/2009 |
| WO | WO2009145813 A1 | 12/2009 |
| WO | WO2009151515 A1 | 12/2009 |
| WO | WO2010129350 A2 | 11/2010 |
| WO | WO2010129374 A2 | 11/2010 |
| WO | WO2011031871 A1 | 3/2011 |
| WO | WO2012021643 A2 | 2/2012 |
| WO | WO2013/078242 A1 | 5/2013 |
| WO | WO2013/078249 A1 | 5/2013 |
| WO | WO2013078245 A1 | 5/2013 |
| WO | WO2013078247 A1 | 5/2013 |
| WO | WO2013078251 A1 | 5/2013 |
| WO | WO2013078252 A1 | 5/2013 |
| WO | WO2013115898 A2 | 8/2013 |
| WO | WO2013162646 A1 | 10/2013 |

OTHER PUBLICATIONS

Taiwanese Office Action Issued in TW Appliation No. 101143545, dated Dec. 22, 2017, 13 Pages.

Aharoni et al., "Synthesis of InAs/CdSe/ZnSe Core/Shell1/SHell2 Structures with bright and stable Near-Infrared Flourescence"; J. Am. Chem. Soc.; 2006; 128; 257-264.

Aydin, et al., "Colloidal Synthesis and Characterization of Cdse Quantum Dots: Role of Cd:Se Molar Ratio and Temperature", IJSTR (2016), vol. 5, No. 01; pp. 66-70.

Bala et al., "Interaction of Different Metal Ions with Carboxylic Acid Group: A Quantative Study"; J. Phys/ Chem. A; 2007; 111; 6183-6190.

Chinese Office Action—CN Application No. 201280072253.9 dated Feb. 17, 2017, cited references listed within.

Cyntec Industries Inc., "Cyanex® 921 Extractant" brochure, 2008 (16 pages).

Donega et al., "Physicochemical Evaluation of the Hot-Injection Method, a Synthesis Route for Monodisperse Nanocrystals"; Small; 2005; 1; No. 12; 1152-1162.

Dukes, III, et al., "Synthesis of Magic-Sized CdSe and CdTe Nanocrystals with Diisooctylphosphinic Acid" Chem. Mater., 2010, vol. 22; pp. 6402-6408.

Evans et al., "Mysteries of TOPSe Revealed: Insight into Quantum Dot Nucleation"; J. Am. Chem. Soc.; 2010; vol. 132 (32) (3 pages).

Evans et al., Supporting Documents for: "Mysteries of TOPSe Revealed: Insights into Quantum Dot Nucleation"; vol. 132, (32) (21 pages).

Gomes et al., "Binding of Phosphonic Acids to CdSe Quantum Dots: A Solution NMR Study"; J. Phys. Chem. Lett.; 2011; 2; 145-152.

International Search Report dated Feb. 5, 2013; International Application No. PCT/US2012/066145; International Filing Date Nov. 20, 2012 (5 pages).

International Search Report dated Feb. 8, 2013; International Application No. PCT/US12/66140; International Filing Date Nov. 20, 2012 (2 pages).

Jang et al., "High quality CdSeS nanocrystals synthesized by facile single injection process and their electroluminescence"; ChemComm; 2003; 2964-2965.

(56) References Cited

OTHER PUBLICATIONS

Kopping et al., "Identification of Acidic Phosphorus-Containing Ligands Involved in the Surface Chemistry of CdSe Nanoparticles Prepared in Tri-N-octylphosphine Oxide Solvents"; J. Am. Chem. Soc. 2008; 130; 5689-5698.

Kopping et al., Supporting Documents for: "Identification of Acidic Phosphorous-Containing Ligands Involved in the Surface Chemistry of CdSe Nanoparticles Prepared in Tri-n-Octylphosphine Oxide (TOPO) Solvents" (5 pages).

Kortan et al., "Nucleation and Growth of CdSe on ZnS Quantum Crystallite Seeds, and Vice Versa, in Inverse Micelle Media"; J. Am. Chem. Soc.; 1990; vol. 112 No. 4; 1327-1332.

Lorenz et al., "Surfactant—Semiconductor Interfaces: Perturbation of the Photoluminescence of Bulk Cadmium Selenide by Adsorption of Tri-n-octylphosphine Oxide as a Probe of Solution Aggregation v Relevance to Nanocrystals Stabilization", J. Am Chem. Soc., (1998), vol. 120, pp. 10970-10975.

Murray, "Synthesis and Characterization of II-VI Quantum Dots and Their Assembly into 3D Quantum Dot Superlattices"; Thesis; Massachusetts Institute of Technology; 1995 (166 pages).

Owen et al., "Precursor Conversion Kinetics and the Nucleation of Cadmium Selenide Nanocrystals"; J. Am. Chem. Soc.; 2010; 132; 18206-18213.

Owen et al., Supporting Documents for: "Precursor conversion kinetics and the nucleation of cadmium selenide nanocrystals" (13 pages).

PCT International Search Report dated Feb. 4, 2013 in International Application No. PCT/US2012/066158, Filed Nov. 20, 2012.

PCT International Search Report dated Feb. 5, 2013 in International Application No. PCT/US2012/066145, Filed Nov. 20, 2012.

PCT International Search Report dated Mar. 25, 2013 in International Application No. PCT/US2012/066154, Filed Nov. 20, 2012.

Peng et al., "Kinetics of II-VI and III-V Colloidal Semiconductor Nanocrystal Growth: "Focusing" of Size Distributions"; J. Am. Chem. Soc.; 1998; 120; 5343-5344.

Pietryga, et al., "Utilizing the Lability of Lead Selenide to Produce Heterostructured Nanocrystals with Bright, Stable Infrared Emission", J. Am. Chem. Soc., 2008, vol. 130; pp. 4879-4885.

Puzder et al., "The Effect of Organic Ligand Binding on the Growth CdSe Nanoparticles Probed by Ab-Initio Calculations"; Nanoletters; 2004; vol. 4, No. 12; 1-6.

Reiss et al., "The Growth of Uniform Colloidal Dispersion"; Journal of Chamical Physics; 1951; vol. 19; No. 4; 482-487.

Schreuder et al., "Control of Surface State Emission via Phosphonic Acid Modulation in Ultrasmall CdSe Nanocrystals: The Role of Ligand Electronegativity"; J. Phys. Chem. C.; 2009; 113; 8169-8176.

Shen et al., "One-Step Synthesis of White-Light-Emitting Quantum Dots at Low Temperature"; Inorg. Chem.; 2009; 48; 8689-8694.

Steckel, J. S., Thesis entitled: "The Synthesis of Inorganic Semiconductor Nanocrystalline Materials for the Purpose of Creating Hybrid Organic/Inorganic Light-Emitting Devices", Massachusetts Institute of Technology, Sep. 2006.

Taiwanese Office Action—Taiwanese Patent Application No. 101143543 dated Oct. 3, 2016, citing references listed within.

Talapin, et al., "Highly Luminescent Monodisperse CdSe and CdSe/ZnS Nanocrystals Synthesized in a Hexadecylamine-Trioctylphosphine Oxide-Trioctylphospine Mixture", Nano Letters, 2001, vol. 1, No. 4; pp. 207-211.

Wang et al., "Morphology Control of Cadmium Selenide Nanocrystals: Insights into the Roles of Di-n-octylphosphine Oxide (DOPO) and Di-n-octylphosphinic Acid (DOPA)"; J. Am. Chem. Soc.; 2012; 134; 5369-5380.

Wang et al., "Spectroscopic Identification of Tri-n-octylphosphine Oxide (TOPO) Impurities and Elucidation of Their Roles in Cadmium Selenide Quantum-Wire Growth"; J. Am. Chem. Soc.; 2009; 131; 4983-4994.

Wang et al., "The Trouble with TOPO; Identification of Adventitious Impurities Beneficial to the Growth of Cadmium Selenide Quantum Dots, Rods, and Wires"; Nano Letters; 2008.

Wang et al., Supporting Documents for: "Morphology Control of Cadmiun Selenide Nanocrystals: Insight into the Roles of Di-n-octylphosphine Oxide (DOPO) and Di-n-octylphosphinic Acid (DOPA)" (37 pages).

Wang et al., Supporting Documents for: "Spectoscopic Identification of Tri-n-octylphosphine Oxide (TOPO) Impurities and Elucidation of Their Roles in Cadmium Selenide Quantum-Wire Growth" (49 pages).

Wang et al., Supporting Documents for: The Trouble with TOPO; Identification of Adventitious Impurities Beneficial to the Growth of Cadmium Selenide Quantum Dots, Rods and Wires (7 pages).

Wolcott et al., "CdSe Quantum Rod Formation Aided by in Situ TOPO Oxidation"; Chem. Mater.; 2010; 22; 2814-2821.

Wolcott et al., Supporting Documents for: "CdSe Quantum Rod Formation Aided by In Situ TOPO Qxidation" (10 pages).

Written Opinion dated Feb. 5, 2013; International Application No. PCT/US2012/066145; International Filing Date Nov. 20, 2012 (15 pages).

Written Opinion dated Feb. 8, 2013; International Application No. PCT/US12/66140; International Filing Date Nov. 20, 2012 (6 pages).

Xie et al., "Synthesis and Characterization of Highly Luminescent CdSe-Core CdS/Zn0.5Cd0.5S/ZnS Multishell Nanocrystals"; J. Am. Chem. Soc.; 2005; 127; 7480-7488.

PCT International Search Report and Written Opinion dated Mar. 25, 2013 in International Application No. PCT/US2012/066154, filed Nov. 20, 2012, which International Application is the parent of the present application.

Bachmann, et al., "Temperature Quenching of Yellow $Ce^{3+}$ Luminescence in YAG:Ce", Chem. Mater. (2009), vol. 21, pp. 2077-2084.

Chang, et al., "Synthesis and Photoluminescence Characteristics of High Color Purity and Brightness $Li_3Ba_2Gd_3(MoO_4)_8$:$Eu^{3+}$ Red Phosphors" J. Phys. Chem. C (2010), vol. 114, pp. 3645-3652.

Cumberland, et al., "Inorganic Clusters as Single-Source Precursors for Preparation of CdSe, ZnSe, and CdSe/ZnS Nanomaterials" Chem. Mater. (2002), vol. 14, pp. 1576-1584.

Dabbousi, et al., "(CdSe) ZnS Core-Shell Quantum Dots: Synthesis and Characterizaqtion of a Size Series of Highly Luminescent Nanocrystallites", J. Phys. Chem. 101, 9463, 1997.

deMello et al., "An Improved Experimental Determination of External Photoluminescence Quantum Efficiency", Adv. Mater. (1997), vol. 9(3), p. 230.

Dukes, et al., "Luminescent Quantum Dots", ECS Transactions (2011), vol. 33, pp. 3-16.

Gindele, et al., "Phonon interaction of single excitons and biexcitons", Phys. Rev. B (1999), vol. 60, R2157(R).

Gong, "Synthesis, optical properties, and surface modification of magic-size semiconductor nanocrystals, nanowires and nanoplatelets" San Diego State University, 2011. <http://sdsu-dspace.calstate.edu/handle/10211.10/1438>.

Hines, et al., "Synthesis and Characterization of Strongly Luminescing ZnS-Capped CdSe Nanocrystals" J. Phys. Chem. (1996), vol. 100, pp. 468-471.

Jiao, et al, "Measurement and Analysis of Temperature-Dependent Optical Modal Gain in Single-Layer InAs/InP(100) Quantum-Dot Amplifiers in the 1.6-to 1.8-μm Wavelength Range", IEEE Photonics Journal (2012), vol. 4, No. 6, pp. 2292-2306.

Jing, et al., "Temperature-Dependent Photoluminescence of CdSe-Core CdS/CdZnS/ZnS-Multishell Quantum Dots", J. Phys. Chem C (2009), vol. 113, pp. 13545-13550.

Kim, S., "Assembly and Control of Light-Emitting Nanostructures for Near-Field Imaging", NNIN REU Research Accomplishments (2008), pp. 136-137.

Koole, et al., "Paramagnetic lipid-coated silica nanoparticles with a fluorescent quantum dot core: a new contrast agent platform for multimodality imaging", Bioconjugate Chemistry (2008) vol. 19, No. 12, pp. 2471-2479.

Lu, et al., "Temperature-dependent photoluminescence in light-emitting diodes", www.nature.com/scientificreports (2014), 4 : 6131, pp. 1-7.

Morello, et al., "Temperature and Size Dependence of Nonradiative Relaxation and Exciton—Phonon Coupling in Colloidal CdTe Quantum Dots", J. Phys. Chem C (2007), vol. 111, pp. 5846-5849.

(56) References Cited

OTHER PUBLICATIONS

Murray, C., et al., "Synthesis and Characterization of Monodisperse Nanocrystals and Close-Packed Nanocrystal Assemblies", *Annu. Rev. Mater. Sci.* (2000), vol. 30, pp. 545-610.

Murray, C., et al., "Synthesis and Characterization of Nearly Monodisperse CdE (E = S, Se, Te) Semiconductor Nanocrystallites" (Nov. 1993), *J. Am. Chem. Soc.*, 115, pp. 8706-8715.

Murray, C.B., Thesis, entitled "Synthesis and Characterization of II-VI Quantum Dots and Their Assembly into 3-D Quantum Dot Superlattices", Massachusetts Institute of Technology, Sep. 1995.

Nexxus Lighting Delivers First Commercially-Available Quantum Dot-LED Replacement Light Bulbs. *LED Professional*, Mar. 12, 2010. <http://www.led-professional.com/products/led-lamps/nexxus-lighting-delivers-first-commercially-available-quantum-dot-led-replacement-light-bulbs>.

Peng, et al., "Formation of High-Quality CdTe, CdSe, and CdS Nanocrystals Using CdO as Precursor", *J. Am. Chem. Soc.* (2001), vol. 123, pp. 183-184.

Peng, Z., et al., "Mechanisms of the Shape Evolution of CdSe Nanocrystals", *J. Am. Chem. Soc.* (2001) vol. 123, pp. 1389-1395.

QLED Technology. QD Vision, Oct. 18, 2010, retrieved from the Internet. <http://web.archive.org/web/201018132134/http://www.qdvision.com/qled-technology>.

Qu, et al., "Alternative Routes Toward High Quality CdSe Nanocrystals", *Nano Lett.* (2001), vol. 1, No. 6, pp. 333-337.

Quantum Dots begin to impact backlight and general illumination applications. *LEDs Magazine,* Feb. 9, 2010. <http://ledsmagazine.com/news/7/2/12>.

Reiss, et al., "Core/Shell Semiconductor Nanocrystals" *small* (2009), vol. 5, No. 2, pp. 154-168.

Seravalli, et al., "Quantum dot strain engineering for light emission at 1.3, 1,4 and 1.5 μm" *Appl. Phys. Lett.* (2005), vol. 87, 063101 (3pp).

Valerini, et al., "Temperature dependence of the photoluminescence properties of colloidal CdSe/ZnS core/shell quantum dots embedded in a polystyrene matrix" *Phys. Rev. B* (2005), vol. 71, 235409.

Wang, et al., "Temperature dependent photoluminescence investigation of AlGaAs/GaAs quantum wires grown by flow rate modulation epitaxy", *Appl. Phys. Lett.* (1995), vol. 67, No. 24, pp. 3629-3631.

Woo, et al., "Thermal behavior of a quantum dot nanocomposite as a color converting material and its application to white LED" *Nanotechnology* (2010), vol. 21, No. 49, 495704.

Zhou, et al., "Temperature-dependent photoluminescence properties of Mn:ZnCuInS nanocrsytais", *Optical Materials Express* (2015), vol. 5, No. 9, (12 pgs).

Zhao, W-R., et al., "Temperature Dependence of Emission Properties of Self-Assembled InGaN Quantum Dots", Chin. Phys. Lett., vol. 31, No. 11 (2014) 114205.

Chinese Office Action dated Apr. 22, 2016 in CN Application No. 2012800722539, which is the Chinese counterpart of related U.S. Appl. No. 14/451,125.

Chinese Search Report dated Apr. 13, 2016 in CN Application No. 2012800722539, which is the Chinese counterpart of related U.S. Appl. No. 14/451,125.

\* cited by examiner

Absorption spectrum of the core material (559nm peak, 13nm HWHM).

Absorption spectrum of the core material (448nm peak, 16nm HWHM).

Absorption and emission spectrum of grCdSeCS-044
(Emission Peak: 598nm; FWHM 24nm)

Absorption and emission spectrum of ggCdSeCS-041
(Emission Peak: 517nm; FWHM 40nm)

Absorption spectrum of the core material (448nm peak, 16nm HWHM).

Absorption and emission spectrum of ggCdSeCS-121
(Emission Peak: 531nm; FWHM 41nm)

Absorption spectrum of the core material
(576 nm peak, 12 nm HWHM).

Absorption and emission spectrum of grCdSeCS-145
(Emission Peak: 617 nm; FWHM 28 nm)

SEMICONDUCTOR NANOCRYSTALS, METHODS FOR MAKING SAME, COMPOSITIONS, AND PRODUCTS

This application is a continuation of International Application No. PCT/US2012/066154, filed 20 Nov. 2012, which was published in the English language as International Publication No. WO 2013/115898 on 8 Aug. 2013, which International Application claims priority to U.S. Provisional Patent Application No. 61/595,116, filed on 5 Feb. 2012 and U.S. Provisional Patent Application No. 61/678,902, filed on 2 Aug. 2012. Each of the foregoing is hereby incorporated herein by reference in its entirety for all purposes.

TECHNICAL FIELD OF THE INVENTION

The present invention relates to technical field of semiconductor nanocrystals, including methods, and compositions and products including same.

BACKGROUND OF THE INVENTION

The solid state photoluminescence external quantum efficiency of semiconductor nanocrystals have been observed to be adversely affected during use by at least the temperature of the environment in which the nanocrystals are used. It would represent an advance in the art to provide a semiconductor nanocrystal and a method for making semiconductor nanocrystals which address the adverse effect of the environmental temperature on solid state photoluminescence external quantum efficiency of semiconductor nanocrystals.

SUMMARY OF THE INVENTION

The present invention relates to a semiconductor nanocrystal, methods for preparing semiconductor nanocrystals, and to compositions, components, and other products including semiconductor nanocrystals described herein and/or those prepared in accordance with any of the methods described herein.

In accordance with one aspect of the present invention, there is provided a semiconductor nanocrystal characterized by having a solid state photoluminescence external quantum efficiency at a temperature of 90° C. or above that is at least 95% of the solid state photoluminescence external quantum efficiency of the semiconductor nanocrystal at 25° C.

In accordance with another aspect of the present invention, there is provided a semiconductor nanocrystal having a multiple LO phonon assisted charge thermal escape activation energy of at least 0.5 eV.

As used herein, a multiple LO phonon assisted charge thermal escape activation energy refers to multiple LO phonon assisted charge thermal escape activation energy as determined with reference to the following equation:

$$I(T)=I_0[1+A\exp(-E/kT)]^{-1}$$

wherein A is a constant, $k=1.38\times10^{-23}$ Joules/Kelvin, T is temperature (Kelvin), and E is a value of the multiple LO phonon assisted charge thermal escape activation energy obtained by measuring solid state photoluminescence external quantum efficiency of the nanocrystal as a function of temperature and plotting $\ln[I_o/I(T)-1]$ vs. $1/kT$ where $I_o$ is the integrated photoluminescence (PL) intensity of the nanocrystal at room temperature and I(T) is the integrated PL intensity of the nanocrystal at temperature (T) where T spans from 70° C. to 140° C., and the absolute value of the slope of the line is the value of the activation energy.

In accordance with a further aspect of the present invention, there is provided a semiconductor nanocrystal characterized by having a solid state photoluminescence external quantum efficiency of at least 80% at a temperature of 90° C. or above.

In accordance with a further aspect of the present invention, there is provided a semiconductor nanocrystal characterized by having a radiative lifetime at a temperature of 90° C. or above that is at least 80% of the radiative lifetime at 25° C.

In accordance with a further aspect of the present invention, there is provided a semiconductor nanocrystal capable of emitting light with a maximum peak emission at a wavelength in a range from 590 nm to 650 nm characterized by an absorption spectrum, wherein the absorption ratio of Optical Density (OD) at 325 nm to OD at 450 nm is greater than 5.5.

In accordance with a further aspect of the present invention, there is provided a semiconductor nanocrystal capable of emitting light with a maximum peak emission at a wavelength in a range from 545 nm to 590 nm characterized by an absorption spectrum, wherein the absorption ratio of OD at 325 nm to OD at 450 nm is greater than 7.

In accordance with a further aspect of the present invention, there is provided a semiconductor nanocrystal capable of emitting light with a maximum peak emission at a wavelength in a range from 495 nm to 545 nm characterized by an absorption spectrum, wherein the absorption ratio of OD at 325 nm to OD at 450 nm is greater than 10.

In accordance with a further aspect of the present invention, there is provided a composition comprising a plurality of semiconductor nanocrystals wherein the solid state photoluminescence efficiency of the composition at a temperature of 90° C. or above is at least 95% of the solid state photoluminescence efficiency of the composition at 25° C.

In accordance with yet a further aspect of the present invention, there is provided a composition comprising a host material and a plurality of semiconductor nanocrystals wherein the solid state photoluminescence efficiency of the composition is at least 80% at a temperature of 90° C. or above.

In accordance with a still further aspect of the present invention, there is provided a composition including at least one semiconductor nanocrystal described herein.

In accordance with a still further aspect of the present invention, there is provided an optical material comprising at least one semiconductor nanocrystal described herein.

In accordance with a still further aspect of the present invention, there is provided a light emitting material comprising at least one semiconductor nanocrystal described herein.

In accordance with a still further aspect of the present invention, there is provided a color-conversion material comprising at least one semiconductor nanocrystal described herein.

In accordance with a still further aspect of the present invention, there is provided an ink comprising at least one semiconductor nanocrystal described herein.

In accordance with a still further aspect of the present invention, there is provided a paint comprising at least one semiconductor nanocrystal described herein.

In accordance with a still further aspect of the present invention, there is provided a taggant comprising at least one semiconductor nanocrystal described herein.

In accordance with a still further aspect of the present invention, there is provided an optical component including at least one semiconductor nanocrystal described herein.

In accordance with a still further aspect of the present invention, there is provided a backlighting unit including at least one semiconductor nanocrystal described herein.

In accordance with a still further aspect of the present invention, there is provided a display including at least one semiconductor nanocrystal described herein.

In accordance with a still further aspect of the present invention, there is provided an electronic device including at least one semiconductor nanocrystal described herein.

In accordance with a still further aspect of the present invention, there is provided an opto-electronic device including at least one semiconductor nanocrystal described herein.

In accordance with a still further aspect of the present invention, there is provided a light-emitting device including at least one semiconductor nanocrystal described herein.

In certain embodiments, a light emitting device includes a light emitting material comprising at least one semiconductor nanocrystal described herein.

In accordance with a still further aspect of the present invention, there is provided a lamp including at least one semiconductor nanocrystal described herein.

In accordance with a still further aspect of the present invention, there is provided a light bulb including at least one semiconductor nanocrystal described herein.

In accordance with a still further aspect of the present invention, there is provided a luminaire including at least one semiconductor nanocrystal described herein.

In accordance with a still further aspect of the present invention, there is provided a method for preparing semiconductor nanocrystals comprising: introducing one or more first shell chalcogenide precursors and one or more first shell metal precursors to a reaction mixture including semiconductor nanocrystal cores, wherein the first shell chalcogenide precursors are added in an amount greater than the first shell metal precursors by a factor of at least about 2 molar equivalents and reacting the first shell precursors at a first reaction temperature of at least 300° C. to form a first shell on the semiconductor nanocrystal cores.

In certain embodiments, the method further comprises: introducing one or more second shell chalcogenide precursors and one or more second shell metal precursors to the reaction mixture including semiconductor nanocrystal cores including the first shell at a second reaction temperature of at least 300° C., wherein the second shell chalcogenide precursors are added in an amount of at least 0.7 molar equivalents of the second shell metal precursors, and reacting the second shell precursors to form a second shell over the first shell on the semiconductor nanocrystal cores.

In accordance with yet another aspect of the present invention, there is provided a population of semiconductor nanocrystals prepared in accordance with any of the methods described herein.

In accordance with a still further aspect of the present invention, there is provided a composition including at least one semiconductor nanocrystal prepared in accordance with any of the methods described herein.

In accordance with a still further aspect of the present invention, there is provided an optical material comprising at least one semiconductor nanocrystal prepared in accordance with any of the methods described herein.

In accordance with a still further aspect of the present invention, there is provided a light emitting material comprising at least one semiconductor nanocrystal prepared in accordance with any of the methods described herein.

In accordance with a still further aspect of the present invention, there is provided a color-conversion material comprising at least one semiconductor nanocrystal prepared in accordance with any of the methods described herein.

In accordance with a still further aspect of the present invention, there is provided an ink comprising at least one semiconductor nanocrystal prepared in accordance with any of the methods described herein.

In accordance with a still further aspect of the present invention, there is provided a paint comprising at least one semiconductor nanocrystal prepared in accordance with any of the methods described herein.

In accordance with a still further aspect of the present invention, there is provided a taggant comprising at least one semiconductor nanocrystal prepared in accordance with any of the methods described herein.

In accordance with a still further aspect of the present invention, there is provided an optical component including at least one semiconductor nanocrystal prepared in accordance with any of the methods described herein.

In accordance with a still further aspect of the present invention, there is provided a backlighting unit including at least one semiconductor nanocrystal prepared in accordance with any of the methods described herein.

In accordance with a still further aspect of the present invention, there is provided a display including at least one semiconductor nanocrystal prepared in accordance with any of the methods described herein.

In accordance with a still further aspect of the present invention, there is provided an electronic device including at least one semiconductor nanocrystal prepared in accordance with any of the methods described herein.

In accordance with a still further aspect of the present invention, there is provided an opto-electronic device including at least one semiconductor nanocrystal prepared in accordance with any of the methods described herein.

In accordance with a still further aspect of the present invention, there is provided a light-emitting device including at least one semiconductor nanocrystal prepared in accordance with any of the methods described herein.

In certain embodiments, a light emitting device includes a light emitting material comprising at least one semiconductor nanocrystal prepared in accordance with any of the methods described herein.

In accordance with a still further aspect of the present invention, there is provided a lamp including at least one semiconductor nanocrystal described herein.

In accordance with a still further aspect of the present invention, there is provided a light bulb including at least one semiconductor nanocrystal prepared in accordance with any of the methods described herein.

In accordance with a still further aspect of the present invention, there is provided a luminaire including at least one semiconductor nanocrystal prepared in accordance with any of the methods described herein.

In accordance with certain aspects, oxygen and/or water may degrade semiconductor nanocrystals or quantum dots described herein during periods of high light flux exposure.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations.

Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1A:
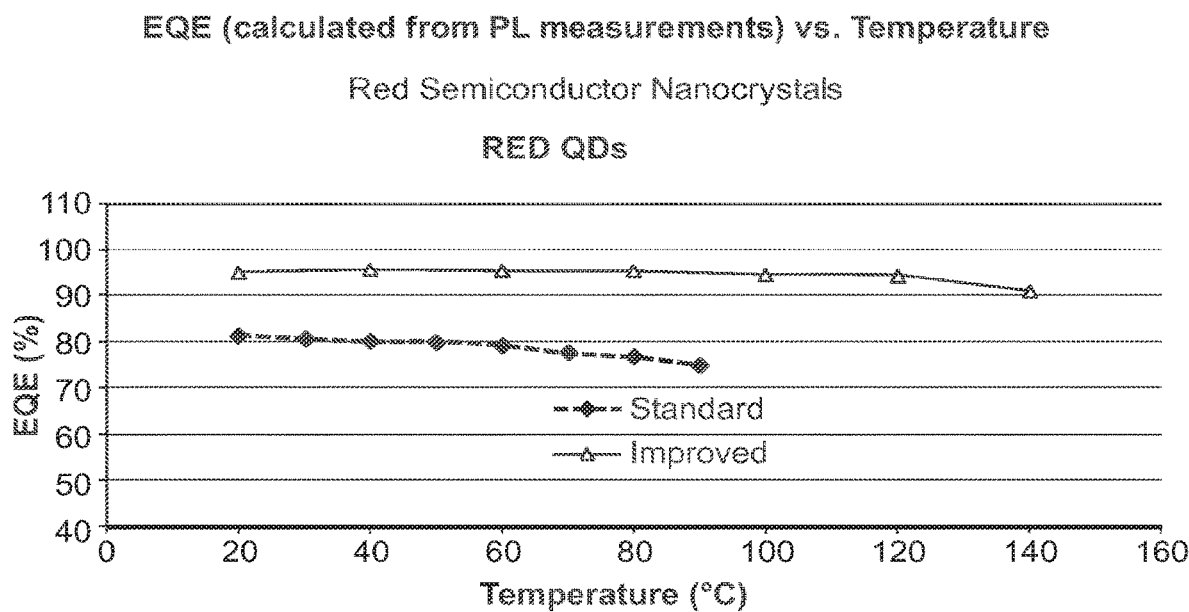
FIGS. 1A and 1B graphically illustrate EQE (calculated from PL measurements) vs. Temperature for examples of embodiments of the present invention and for control samples.

The attached figures are simplified representations presented for purposes of illustration only; the actual structures may differ in numerous respects, particularly including the relative scale of the articles depicted and aspects thereof.

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

The present invention relates to a semiconductor nanocrystals, methods for making and overcoating semiconductor nanocrystals, and to compositions, components, and other products including semiconductor nanocrystals described herein and/or those prepared in accordance with any of the methods described herein.

In accordance with one aspect of the present invention, there is provided a semiconductor nanocrystal characterized by having a solid state photoluminescence external quantum efficiency at a temperature of 90° C. or above that is at least 95% of the solid state photoluminescence external quantum efficiency of the semiconductor nanocrystal at 25° C.

In certain embodiments, the semiconductor nanocrystal has a solid state photoluminescence efficiency at the temperature of 90° C. or above that is from 95 to 100% of the solid state photoluminescence efficiency at 25° C.

In certain embodiments, the temperature of 90° C. or above is in a range, for example, but not limited to, from 90° C. to about 200° C., 90° C. to about 180° C., 90° C. to about 160° C., 90° C. to about 140° C., 90° C. to about 120° C., or 90° C. to about 100° C.

In certain embodiments, the temperature of 90° C. or above is at a temperature, for example, but not limited to, of 100° C. or above, of 120° C. or above, or of 140° C. or above.

In accordance with another aspect of the present invention, there is provided semiconductor nanocrystal having a multiple LO phonon assisted charge thermal escape activation energy of at least 0.5 eV.

As set forth above, a multiple LO phonon assisted charge thermal escape activation energy refers to multiple LO phonon assisted charge thermal escape activation energy as determined with reference to the following equation:

$$I(T)=I_0[1+A\exp(-E/kT)]^{-1}$$

wherein A is a constant and E is a value of the multiple LO phonon assisted charge thermal escape activation energy obtained by measuring solid state photoluminescence external quantum efficiency of the nanocrystal as a function of temperature and plotting $\ln[I_o/I(T)-1]$ vs. $1/kT$ where $I_o$ is the integrated photoluminescence (PL) intensity of the nanocrystal at room temperature and $I(T)$ is the integrated PL intensity of the nanocrystal at temperature (T) where T spans from 70° C. to 140° C., and the absolute value of the slope of the line is the value of the activation energy.

In certain embodiments, the semiconductor nanocrystal has a solid state photoluminescence external quantum efficiency of at least 80% at a temperature of 90° C. or above.

In certain embodiments, the semiconductor nanocrystal has a solid state photoluminescence external quantum efficiency of at least 85% at a temperature of 90° C. or above.

In certain embodiments, the semiconductor nanocrystal has a solid state photoluminescence external quantum efficiency of at least 90% at a temperature of 90° C. or above.

In certain embodiments, the semiconductor nanocrystal has a solid state photoluminescence external quantum efficiency of at least 95% at a temperature of 90° C. or above.

In certain embodiments, the semiconductor nanocrystal has a solid state photoluminescence external quantum efficiency from 95% to 100% at a temperature of 90° C. or above.

In certain embodiments, the temperature of 90° C. or above is in a range, for example, but not limited to, from 90° C. to about 200° C., 90° C. to about 180° C., 90° C. to about 160° C., 90° C. to about 140° C., 90° C. to about 120° C., or 90° C. to about 100° C.

In certain embodiments, the temperature of 90° C. or above is at a temperature, for example, but not limited to, of 100° C. or above, of 120° C. or above, or of 140° C. or above.

In certain embodiments, the semiconductor nanocrystal is characterized by having a solid state photoluminescence external quantum efficiency at a temperature of 90° C. or above that is at least 95% of the solid state photoluminescence external quantum efficiency of the semiconductor nanocrystal at 25° C.

In accordance with another aspect of the present invention, there is provided a semiconductor nanocrystal characterized by having a radiative lifetime at a temperature of 90° C. or above that is at least 80% of the radiative lifetime at 25° C.

In certain embodiments, the temperature of 90° C. or above is in a range, for example, but not limited to, from 90° C. to about 200° C., 90° C. to about 180° C., 90° C. to about 160° C., 90° C. to about 140° C., 90° C. to about 120° C., or 90° C. to about 100° C.

In certain embodiments, the temperature of 90° C. or above is at a temperature, for example, but not limited to, of 100° C. or above, of 120° C. or above, or of 140° C. or above.

In certain embodiments, the semiconductor nanocrystal has a radiative lifetime at the temperature of 90° C. or above that is at least 90% of the radiative lifetime at 25° C.

In certain embodiments, the semiconductor nanocrystal has a radiative lifetime at the temperature of 90° C. or above that is at least 95% of the radiative lifetime at 25° C.

In certain embodiments, the semiconductor nanocrystal has a radiative lifetime at the temperature of 90° C. or above that is from 95 to 100% of the radiative lifetime at 25° C.

In certain embodiments, the semiconductor nanocrystal is characterized by having a solid state photoluminescence external quantum efficiency at a temperature of 90° C. or above that is at least 95% of the solid state photoluminescence external quantum efficiency of the semiconductor nanocrystal at 25° C.

In accordance with a further aspect of the present invention, there is provided a semiconductor nanocrystal capable of emitting light with a maximum peak emission at a wavelength in a range from 590 nm to 650 nm characterized by an absorption spectrum, wherein the absorption ratio of OD at 325 nm to OD at 450 nm is greater than 5.5.

In certain embodiments, the semiconductor nanocrystal has a solid state photoluminescence external quantum efficiency of at least 80% at a temperature of 90° C. or above.

In certain embodiments, the semiconductor nanocrystal has a solid state photoluminescence external quantum efficiency of at least 85% at a temperature of 90° C. or above.

In certain embodiments, the semiconductor nanocrystal has a solid state photoluminescence external quantum efficiency of at least 90% at a temperature of 90° C. or above.

In certain embodiments, the semiconductor nanocrystal has a solid state photoluminescence external quantum efficiency of at least 95% at a temperature of 90° C. or above.

In certain embodiments, the semiconductor nanocrystal has a solid state photoluminescence external quantum efficiency from 95% to 100% at a temperature of 90° C. or above.

In certain embodiments, the temperature of 90° C. or above is in a range, for example, but not limited to, from 90° C. to about 200° C., 90° C. to about 180° C., 90° C. to about 160° C., 90° C. to about 140° C., 90° C. to about 120° C., or 90° C. to about 100° C.

In certain embodiments, the temperature of 90° C. or above is at a temperature, for example, but not limited to, of 100° C. or above, of 120° C. or above, or of 140° C. or above.

In certain embodiments, the semiconductor nanocrystal is characterized by having a solid state photoluminescence external quantum efficiency at a temperature of 90° C. or above that is at least 95% of the solid state photoluminescence external quantum efficiency of the semiconductor nanocrystal at 25° C.

In accordance with a further aspect of the present invention, there is provided a semiconductor nanocrystal capable of emitting light with a maximum peak emission at a wavelength in a range from 545 nm to 590 nm characterized by an absorption spectrum, wherein the absorption ratio of OD at 325 nm to OD at 450 nm is greater than 7.

In certain embodiments, the semiconductor nanocrystal has a solid state photoluminescence external quantum efficiency of at least 80% at a temperature of 90° C. or above.

In certain embodiments, the semiconductor nanocrystal has a solid state photoluminescence external quantum efficiency of at least 85% at a temperature of 90° C. or above.

In certain embodiments, the semiconductor nanocrystal has a solid state photoluminescence external quantum efficiency of at least 90% at a temperature of 90° C. or above.

In certain embodiments, the semiconductor nanocrystal has a solid state photoluminescence external quantum efficiency of at least 95% at a temperature of 90° C. or above.

In certain embodiments, the semiconductor nanocrystal has a solid state photoluminescence external quantum efficiency from 95% to 100% at a temperature of 90° C. or above.

In certain embodiments, the temperature of 90° C. or above is in a range, for example, but not limited to, from 90° C. to about 200° C., 90° C. to about 180° C., 90° C. to about 160° C., 90° C. to about 140° C., 90° C. to about 120° C., or 90° C. to about 100° C.

In certain embodiments, the temperature of 90° C. or above is at a temperature, for example, but not limited to, of 100° C. or above, of 120° C. or above, or of 140° C. or above.

In certain embodiments, the semiconductor nanocrystal is characterized by having a solid state photoluminescence external quantum efficiency at a temperature of 90° C. or above that is at least 95% of the solid state photoluminescence external quantum efficiency of the semiconductor nanocrystal at 25° C.

In accordance with a further aspect of the present invention, there is provided a semiconductor nanocrystal capable of emitting light with a maximum peak emission at a wavelength in a range from 495 nm to 545 nm characterized by an absorption spectrum, wherein the absorption ratio of OD at 325 nm to OD at 450 nm is greater than 10.

In certain embodiments, the semiconductor nanocrystal has a solid state photoluminescence external quantum efficiency of at least 80% at a temperature of 90° C. or above.

In certain embodiments, the semiconductor nanocrystal has a solid state photoluminescence external quantum efficiency of at least 85% at a temperature of 90° C. or above.

In certain embodiments, the semiconductor nanocrystal has a solid state photoluminescence external quantum efficiency of at least 90% at a temperature of 90° C. or above.

In certain embodiments, the semiconductor nanocrystal has a solid state photoluminescence external quantum efficiency of at least 95% at a temperature of 90° C. or above.

In certain embodiments, the semiconductor nanocrystal has a solid state photoluminescence external quantum efficiency from 95% to 100% at a temperature of 90° C. or above.

In certain embodiments, the temperature of 90° C. or above is in a range, for example, but not limited to, from 90° C. to about 200° C., 90° C. to about 180° C., 90° C. to about 160° C., 90° C. to about 140° C., 90° C. to about 120° C., or 90° C. to about 100° C.

In certain embodiments, the temperature of 90° C. or above is at a temperature, for example, but not limited to, of 100° C. or above, of 120° C. or above, or of 140° C. or above.

In certain embodiments, the semiconductor nanocrystal is characterized by having a solid state photoluminescence external quantum efficiency at a temperature of 90° C. or above that is at least 95% of the solid state photoluminescence external quantum efficiency of the semiconductor nanocrystal at 25° C.

In accordance with another aspect of the present invention there is provided a semiconductor nanocrystal characterized by having a solid state photoluminescence external quantum efficiency of at least 80% at a temperature of 90° C. or above.

In certain embodiments, the temperature of 90° C. or above is in a range, for example, but not limited to, from 90° C. to about 200° C., 90° C. to about 180° C., 90° C. to about 160° C., 90° C. to about 140° C., 90° C. to about 120° C., or 90° C. to about 100° C.

In certain embodiments, the temperature of 90° C. or above is at a temperature, for example, but not limited to, of 100° C. or above, of 120° C. or above, or of 140° C. or above.

In certain embodiments, the semiconductor nanocrystal has a solid state photoluminescence external quantum efficiency of at least 85% at a temperature of 90° C. or above.

In certain embodiments, the semiconductor nanocrystal has a solid state photoluminescence external quantum efficiency of at least 90% at a temperature of 90° C. or above.

In certain embodiments, the semiconductor nanocrystal has a solid state photoluminescence external quantum efficiency of at least 95% at a temperature of 90° C. or above.

In certain embodiments, the semiconductor nanocrystal has a solid state photoluminescence external quantum efficiency that is from 95 to 100% at a temperature of 90° C. or above.

In certain embodiments, the semiconductor nanocrystal is characterized by having a solid state photoluminescence external quantum efficiency at a temperature of 90° C. or above that is at least 95% of the solid state photoluminescence external quantum efficiency of the semiconductor nanocrystal at 25° C.

Semiconductor nanocrystals are nanometer sized semiconductor particles that can have optical properties arising from quantum confinement. The particular composition(s), structure, and/or size of a semiconductor nanocrystal can be selected to achieve the desired wavelength of light to be emitted from the semiconductor nanocrystal upon excitation. In essence, semiconductor nanocrystals may be tuned to emit light across the visible spectrum by changing their size. See C. B. Murray, C. R. Kagan, and M. G. Bawendi, *Annual Review of Material Sci.*, 2000, 30: 545-610 hereby incorporated by reference in its entirety. The narrow FWHM of semiconductor nanocrystals can result in saturated color emission. In certain embodiments, FWHM can be, for example, less than 60, less than 50, less than 40, or less than 30. The broadly tunable, saturated color emission over the entire visible spectrum of a single material system is unmatched by any class of organic chromophores (see, for example, Dabbousi et al., *J. Phys. Chem.* 101, 9463 (1997), which is incorporated by reference in its entirety). A monodisperse population of semiconductor nanocrystals will emit light spanning a narrow range of wavelengths.

A semiconductor nanocrystal in accordance with the present invention can comprise one or more inorganic semiconductor materials that can be represented by the formula MX, where M is a metal from a metal donor and X is a compound from an X donor which is capable of reacting with the metal donor to form a material with the general formula MX. In certain embodiments, the M donor and the X donor can be moieties within the same molecule. The M donor can be an inorganic compound, an organometallic compound, or elemental metal. For example, an M donor can comprise cadmium, zinc, magnesium, mercury, aluminum, gallium, indium or thallium, and the X donor can comprise a compound capable of reacting with the M donor to form a material with the general formula MX. Exemplary metal precursors include dimethylcadmium and cadmium oleate. The X donor can comprise a chalcogenide donor or a pnictide donor, such as a phosphine chalcogenide, a bis(silyl) chalcogenide, dioxygen, an ammonium salt, or a tris(silyl) pnictide. Suitable X donors include, for example, but are not limited to, dioxygen, bis(trimethylsilyl) selenide ($(TMS)_2Se$), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl) telluride ($(TMS)_2Te$), bis(trimethylsilyl)sulfide ($(TMS)_2S$), a trialkyl phosphine sulfide such as (tri-noctylphosphine) sulfide (TOPS), an ammonium salt such as an ammonium halide (e.g., $NH_4Cl$), tris(trimethylsilyl) phosphide ($(TMS)_3P$), tris(trimethylsilyl) arsenide ($(TMS)_3As$), or tris (trimethylsilyl) antimonide ($(TMS)_3Sb$). In certain embodiments, the M donor and the X donor can be moieties within the same molecule.

As mentioned above, a semiconductor nanocrystal can comprise one or more semiconductor materials. Examples of semiconductor materials that can be included in a semiconductor nanocrystal (including, e.g., semiconductor nanocrystal) include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

In certain preferred embodiments, a semiconductor nanocrystal in accordance with the present invention can comprise a core comprising one or more semiconductor materials and a shell comprising one or more semiconductor materials, wherein the shell is disposed over at least a portion, and preferably all, of the outer surface of the core. A semiconductor nanocrystal including a core and shell is also referred to as a "core/shell" structure.

For example, a semiconductor nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

A shell can be a semiconductor material having a composition that is the same as or different from the composition of the core. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell semiconductor nanocrystal, the shell or overcoating may comprise one or more layers. The overcoating can comprise at least one semiconductor material which is the same as or different from the composition of the core. An overcoating can have a thickness from about one to about ten monolayers. An overcoating can also have a thickness greater than ten monolayers. In certain embodiments, more than one overcoating can be included on a core. By adjusting the temperature of the reaction mixture during overcoating and monitoring the absorption spectrum of the core, overcoated materials having high emission quantum efficiencies and narrow size distributions can be obtained.

In certain embodiments, the surrounding "shell" material can have a band gap greater than the band gap of the core material. In certain other embodiments, the surrounding shell material can have a band gap less than the band gap of the core material.

In certain preferred embodiments, a core/shell semiconductor nanocrystal has a Type I structure.

In certain embodiments, a shell can be chosen so as to have an atomic spacing close to that of the underlying "core" or shell (e.g., lattice constants that are within up to 13% of each other, and preferably within up to 10% of each other). In certain other embodiments, the shell and core materials can have the same crystal structure.

Examples of semiconductor nanocrystal core/shell structures include, without limitation: red (e.g., CdSe/CdZnS (core/shell); CdSe/ZnS/CdZnS (core/shell/shell), etc.) green (e.g., CdZnSe/CdZnS (core/shell), CdSe/ZnS/CdZnS (core/shell/shell), etc.), and blue (e.g., CdS/CdZnS (core/shell)).

Semiconductor nanocrystals can have various shapes, including, but not limited to, a sphere, rod, disk, other shapes, and mixtures of various shaped particles.

In certain preferred embodiments of the various aspects of the inventions described herein, the semiconductor nanocrystal is undoped.

As used herein, "undoped semiconductor nanocrystal" refers to a semiconductor nanocrystal that emits light due to quantum confinement and without emission from an activator species.

In certain preferred embodiments of the various aspects of the invention described herein, the semiconductor nanocrystal includes a core comprising a first semiconductor material and at least a first shell surrounding the core, wherein the first shell comprises a second semiconductor material. In certain of such embodiments, the first shell has a thickness greater than or equal to the thickness of 1 monolayer of the second semiconductor material. In certain of such embodiments, the first shell has a thickness up to the thickness of about 10 monolayers of the second semiconductor material.

In certain of such preferred embodiments, the semiconductor nanocrystal can include a second shell surrounding the outer surface thereof. In certain of such embodiments, the second shell can comprise a third semiconductor material.

In certain of such preferred embodiments wherein the semiconductor nanocrystal includes a second shell, the second shall can have a thickness greater than or equal to the thickness of 3 monolayers of the material from which it is constituted, e.g., the third semiconductor material. In certain of such embodiments, the second shell can have a thickness up to the thickness of about 20 monolayers of the material from which it is constituted.

In certain more preferred embodiments, the second semiconductor material included in the first shell comprises zinc sulfide, and the second shell comprises a third semiconductor material including one or more metals wherein the one or metals comprises from 0 to less than 100% cadmium.

In one example of a preferred embodiment, the semiconductor nanocrystal includes a core comprising CdSe having a predetermined size, a first shell comprising ZnS at a thickness of about 3-4 monolayers of ZnS, and a second shell comprises $Cd_{1-x}Zn_xS$ wherein $0<x\leq1$ at a thickness of about 9-10 monolayers of $Cd_{1-x}Zn_xS$.

In certain embodiments of the various aspects of the invention described herein, the semiconductor nanocrystal can include a core comprising a first semiconductor material, a first shell comprising a second semiconductor material, and a second shell comprising a third semiconductor material, wherein the first shell has a bandgap which is greater than that of the second shell.

In certain embodiments of the various aspects of the invention described herein, the semiconductor nanocrystal can include a core comprising a first semiconductor material, a first shell comprising a second semiconductor material, and a second shell comprising a third semiconductor material, wherein the first shell has a bandgap which is greater than that of the second shell, and the bandgap of the first shell is also greater than that of the core.

In certain embodiments of the various aspects of the invention described herein, the semiconductor nanocrystal can include a core comprising a first semiconductor material, a first shell comprising a second semiconductor material, a second shell comprising third semiconductor material, and a third shell comprising a fourth semiconductor material, wherein the third shell has a bandgap that is the same as that of the first shell and the second shell has a bandgap that is less than that of the first shell.

In certain embodiments of the various aspects of the invention described herein, the semiconductor nanocrystal can include a core comprising a first semiconductor material, a first shell comprising a second semiconductor material, wherein the core has a bandgap which differs from that of the first shell by at least 0.8 eV.

In certain embodiments of the various aspects of the invention described herein, the semiconductor nanocrystal can include a core comprising a first semiconductor material, a first shell comprising a second semiconductor material, wherein the core has a bandgap which differs from that of the first shell by at least 1 eV.

In certain embodiments of the various aspects of the invention described herein, the semiconductor nanocrystal can include a core comprising a first semiconductor material, the core having a first conduction band energy ($E_{CB}$), and a first shell comprising a second semiconductor material, the first shell having a second conduction band energy ($E_{CB}$), wherein the absolute value of the difference between $E_{CB}$ of the core and $E_{CB}$ of the first shell multiplied by the total shell thickness (nm) surrounding the core in the nanocrystal is greater than 2 eV*nm. In certain embodiments, the absolute value of the difference between $E_{CB}$ of the core and $E_{CB}$ of the first shell multiplied by the total shell thickness (nm) surrounding the core in the nanocrystal is greater than 3 eV*nm. In certain embodiments, the absolute value of the difference between $E_{CB}$ of the core and $E_{CB}$ of the first shell multiplied by the total shell thickness (nm) surrounding the core in the nanocrystal is greater than 4 eV*nm. In embodiments including more than one shell, total shell thickness is the total thickness of all shells surrounding the core.

In certain embodiments of the various aspects of the invention described herein, the semiconductor nanocrystal can include a core comprising a first semiconductor material, the core having a first valence band energy ($E_{VB}$), and a first shell comprising a second semiconductor material, the first shell having a second valence band energy ($E_{VB}$), wherein the absolute value of the difference between $E_{VB}$ of the core and $E_{VB}$ of the first shell multiplied by the total shell thickness (nm) surrounding the core in the nanocrystal is greater than 2 eV*nm. In certain embodiments, the absolute value of the difference between $E_{VB}$ of the core and $E_{VB}$ of the first shell multiplied by the total shell thickness (nm) surrounding the core in the nanocrystal is greater than 3 eV*nm. In certain embodiments, the absolute value of the difference between $E_{VB}$ of the core and $E_{VB}$ of the first shell multiplied by the total shell thickness (nm) surrounding the core in the nanocrystal is greater than 4 eV*nm. In embodiments including more than one shell, total shell thickness is the total thickness of all shells surrounding the core.

In certain embodiments of the various aspects of the invention described herein, the semiconductor nanocrystal including a first shell and a second shell can further include one or more additional shells on the outer surface of the nanocrystal. Any of such additional shells can partially or fully surround the outer surface of the nanocrystal on which it is disposed. Preferably an additional shell fully surrounds the outer surface.

In certain preferred embodiments, the semiconductor nanocrystals are prepared in accordance with a method described herein.

Semiconductor nanocrystals (also referred to as quantum dots) preferably have ligands attached thereto. Semiconductor nanocrystals within the scope of the present invention include, without limitation, green CdSe semiconductor nanocrystals having oleic acid ligands and red CdSe semiconductor nanocrystals having oleic acid ligands. Alternatively, or in addition, octadecylphosphonic acid ("ODPA") ligands may be used instead of, or in addition to, oleic acid ligands. The ligands can facilitate dispersibility of the nanocrystals in a medium.

Ligands can be derived from a coordinating solvent that may be included in the reaction mixture during the growth process. Ligands can be added to the reaction mixture. Ligands can be derived from a reagent or precursor included in the reaction mixture for synthesizing the semiconductor nanocrystals. Ligands can be exchanged with ligands on the surface of a semiconductor nanocrystal. In certain embodiments, semiconductor nanocrystals can include more than one type of ligand attached to an outer surface.

In certain embodiments of the various aspects of the inventions described herein, semiconductor nanocrystals can include aliphatic ligands attached thereto. According to one aspect, exemplary ligands include oleic acid ligands and octadecylphosphonic acid ("ODPA") ligands.

Ligands can be selected based on the particular end-use application in which the semiconductor nanocrystals are to be included. Such selection is within the skill of the person of ordinary skill in the relevant art.

The emission from a semiconductor nanocrystal capable of emitting light can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, and/or the structure of the semiconductor nanocrystal (e.g., core, core/shell, core/shell/shell, and other structural variations). For example, a semiconductor nanocrystal comprising CdSe can be tuned in the visible region; a semiconductor nanocrystal comprising InAs can be tuned in the infra-red region. The narrow size distribution of a population of semiconductor nanocrystals capable of emitting light can result in emission of light in a narrow spectral range. The population can be monodisperse preferably exhibits less than a 15% rms (root-mean-square) deviation in diameter of such semiconductor nanocrystals, more preferably less than 10%, most preferably less than 5%.

Semiconductor nanocrystals of the present invention can have spectral emissions in a narrow range of no greater than about 75 nm, for example, no greater than about 70, no greater than about 60 nm, preferably no greater than about 50 nm, more preferably no greater than about 40 nm, and most preferably no greater than about 30 nm full width at half maximum (FWHM) for such semiconductor nanocrystals that emit in the visible region of the electromagnetic spectrum. In certain embodiments, spectral emissions in a narrow range of no greater than about 25 nm (e.g., no greater than about 20 nm, or no greater than about 15 nm), can be preferred. IR-emitting semiconductor nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting semiconductor nanocrystal diameters decreases.

A semiconductor nanocrystal in accordance with the present invention can emit light in a predetermined spectral region. As discussed above, tuning the emission to fall within a predetermined spectral region can be achieved by selection of the size of the semiconductor nanocrystal, the composition of the semiconductor nanocrystal, and/or the structure of the semiconductor nanocrystal, which is within the skill or the person of ordinary skill in the art.

In certain embodiments of the present invention, semiconductor nanocrystals that emit wavelengths characteristic of red light are desirable. In certain embodiments, semiconductor nanocrystals capable of emitting red light emit light having a peak center wavelength in a range from about 615 nm to about 635 nm, and any wavelength in between whether overlapping or not, are preferred. For example, the semiconductor nanocrystals can be capable of emitting red light having a peak center wavelength of about 630 nm, of about 625 nm, of about 620 nm, or about 615 nm. In certain embodiments, semiconductor nanocrystals capable of emitting red light emit light having a peak center wavelength in a range from about 600 nm to about 615 nm, and any wavelength in between whether overlapping or not, are preferred. For example, the semiconductor nanocrystals can be capable of emitting red light having a peak center wavelength of about 615 nm, of about 610 nm, of about 605 nm, or of about 600 nm.

In certain embodiments of the present invention, semiconductor nanocrystals that emit wavelength characteristic of green light are desirable. In certain preferred embodiments, semiconductor nanocrystals capable of emitting green light emit light having a peak center wavelength in a range from about 520 nm to about 545 nm, and any wavelength in between whether overlapping or not. For example, the semiconductor nanocrystals can be capable of emitting green light having a peak center wavelength of about 520 nm, of about 525 nm, of about 535 nm, or of about 540 nm.

According to further aspects of the present invention, light-emitting semiconductor nanocrystals exhibit a narrow emission profile less than or equal to about 60 nm at full width half maximum (FWHM). In certain embodiments, the FWHM is less than about 60 nm, less than about 50 nm, less than about 40 nm, less than about 30 nm, or less than about 20 nm. In certain embodiments, a FWHM in a range from about 15 nm to about 60 nm can be preferred. The narrow emission profile of semiconductor nanocrystals of the present invention allows the tuning of the semiconductor nanocrystals and mixtures of semiconductor nanocrystals to emit saturated colors thereby increasing color gamut and power efficiency beyond that of conventional LED lighting displays.

A semiconductor nanocrystal described herein can be included in a population of semiconductor nanocrystals, a formulation or other composition, and/or end-use applications that includes other semiconductor nanocrystals. One or more of such other semiconductor nanocrystals can also comprise semiconductor nanocrystals described herein. In such embodiments, one or more of the semiconductor nanocrystals so included can be selected to have emission characteristics that are distinct from those of any one or more of other nanocrystals.

For example, a population of semiconductor nanocrystals designed to emit a predominant wavelength of, for example, in the green spectral region and having an emission profile with a FWHM of about, for example, less than 40 nm can be included or used in combination with semiconductor nanocrystals designed to emit a predominant wavelength in the red spectral region and having an emission profile with a FWHM of about, for example 30-40 nm. Such combinations can be stimulated by blue light to create trichromatic white light.

The semiconductor nanocrystals used in a formulation, optical material, or other composition are selected based on the desired peak emission wavelength or combinations of wavelengths desired for the particular intended end-use application for the formulation, optical material, or other composition.

In accordance with another aspect of the present invention, there is provided a composition comprising a plurality of semiconductor nanocrystals wherein the solid state photoluminescence efficiency of the composition at a temperature of 90° C. or above is at least 95% of the solid state photoluminescence efficiency of the composition at 25° C.

In certain embodiments, the composition has a solid state photoluminescence efficiency at the temperature of 90° C. or above that is from 95 to 100% of the solid state photoluminescence efficiency at 25° C.

In certain embodiments, the temperature of 90° C. or above is in a range, for example, but not limited to, from 90° C. to about 200° C., 90° C. to about 180° C., 90° C. to about 160° C., 90° C. to about 140° C., 90° C. to about 120° C., or 90° C. to about 100° C.

In certain embodiments, the temperature of 90° C. or above is at a temperature, for example, but not limited to, of 100° C. or above, of 120° C. or above, or of 140° C. or above.

In certain embodiments, the composition has a solid state photoluminescence efficiency at the temperature of 90° C. or above that is from 95 to 100% of the solid state photoluminescence efficiency at 25° C.

In accordance with another aspect of the present invention, there is provided a composition comprising a host material and a plurality of semiconductor nanocrystals wherein the solid state photoluminescence efficiency of the composition is at least 80% at a temperature of 90° C. or above.

In certain embodiments, the temperature of 90° C. or above is in a range, for example, but not limited to, from 90° C. to about 200° C., 90° C. to about 180° C., 90° C. to about 160° C., 90° C. to about 140° C., 90° C. to about 120° C., or 90° C. to about 100° C.

In certain embodiments, the temperature of 90° C. or above is at a temperature, for example, but not limited to, of 100° C. or above, of 120° C. or above, or of 140° C. or above.

In certain embodiments, the composition has a solid state photoluminescence external quantum efficiency of at least 85% at a temperature of 90° C. or above.

In certain embodiments, the composition has a solid state photoluminescence external quantum efficiency of at least 90% at a temperature of 90° C. or above.

In certain embodiments, the composition has a solid state photoluminescence external quantum efficiency of at least 95% at a temperature of 90° C. or above.

In certain embodiments, the composition has a solid state photoluminescence external quantum efficiency that is from 95 to 100% at a temperature of 90° C. or above.

In certain embodiments of the various aspects of the composition described herein, the composition preferably includes a semiconductor nanocrystal described herein.

Examples of compositions include, but are not limited to, optical materials, color converting materials, inks, paints, taggants, light-emitting materials, etc.

In certain embodiments of the various aspects of the composition described herein, the composition further includes a host material. In certain of such embodiments, the semiconductor nanocrystals are distributed within the host material. In certain of such embodiments, a uniform or substantially uniform distribution of semiconductor nanocrystals within the host material is preferred.

A host material can be selected based upon the intended end-use application for the composition. According to one aspect, a host material can comprise a flowable host material. Flowable host materials can be useful for applications in which a composition is to be included, for example, in an optical component such as light transmissive glass tubes or capillary tubes or other glass containers, which are to be exposed to light. Such compositions can include various amounts of one or more type of semiconductor nanocrystals and one or more host materials. Such compositions can further include one or more scatterers. Other optional additives or ingredients can also be included in a composition. In certain embodiments, a composition can further include one or more initiators, e.g., without limitation, photo initiators. One of skill in the art will readily recognize from the present invention that additional ingredients can be included depending upon the particular intended application for the semiconductor nanocrystals.

An optical material, color converting material, light-emitting material, or other composition within the scope of the disclosure may include a host material, which may be present in an amount from about 50 weight percent and about 99.5 weight percent, and any weight percent in between whether overlapping or not. In certain embodiment, a host material may be present in an amount from about 80 to about 99.5 weight percent. Examples of specific useful host materials include, but are not limited to, polymers, oligomers, monomers, resins, binders, glasses, metal oxides, and other nonpolymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include cross-linked polymers and solvent-cast polymers. Examples of other preferred host materials include, but are not limited to, glass or a transparent resin. In particular, a resin such as a non-curable resin, heat-curable resin, or photocurable resin is suitably used from the viewpoint of processability. Specific examples of such a resin, in the form of either an oligomer or a polymer, include, but are not limited to, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like. Other suitable host materials can be identified by persons of ordinary skill in the relevant art.

Host materials can also comprise silicone materials. Suitable host materials comprising silicone materials can be identified by persons of ordinary skill in the relevant art.

In certain embodiments and aspects of the inventions contemplated by this disclosure, a host material comprises a photocurable resin. A photocurable resin may be a preferred host material in certain embodiments, e.g., in embodiments in which the composition is to be patterned. As a photocurable resin, a photo-polymerizable resin such as an acrylic acid or methacrylic acid based resin containing a reactive vinyl group; a photo-crosslinkable resin which generally contains a photo-sensitizer, such as polyvinyl cinnamate, benzophenone, or the like may be used. A heat-curable resin may be used when a photo-sensitizer is not used, or in combination. These resins may be used individually or in combination of two or more.

In certain embodiments and aspects of the inventions contemplated by this disclosure, a host material can comprise a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like can be dissolved in solvents known to those skilled in the art. Upon evaporation of the solvent, the resin forms a solid host material for the semiconductor nanoparticles.

In certain embodiments, acrylate monomers and/or acrylate oligomers which are commercially available from Radcure and Sartomer can be preferred.

Embodiments of the invention include compositions wherein the host material comprises a material with moderate or high dielectric or insulating properties.

Embodiments of the invention include compositions wherein the host material comprises a material with electrically insulating properties.

Embodiments of the invention include compositions in which semiconductor nanocrystals can be further encapsulated. Nonlimiting examples of encapsulation materials, related methods, and other information that may be useful are described in International Application No. PCT/US2009/01372 of Linton, filed 4 Mar. 2009 entitled "Particles Including Nanoparticles, Uses Thereof, And Methods" and U.S. Patent Application No. 61/240,932 of Nick et al., filed 9 Sep. 2009 entitled "Particles Including Nanoparticles, Uses Thereof, And Methods", each of the foregoing being hereby incorporated herein by reference in its entirety.

The total amount of semiconductor nanocrystals included in an optical material, color converting material, light emitting material, or other composition that includes a host material, such as for example a polymer, within the scope of the invention can be in a range from about 0.01 to about 50 weight percent, and any weight percent in between. In certain applications, an amount in a range from about 0.05 weight percent to about 5 weight percent can be desirable. In certain applications, an amount in a range from about 0.01 weight percent to about 10 weight percent can be desirable. Higher loadings may be desirable to achieve thinner films with high OD, and hence lower thermal resistance. The amount of semiconductor nanocrystals included in an optical material or other composition can vary within such range depending upon the application and the form in which the semiconductor nanocrystals are included (e.g., film, optics (e.g., capillary), encapsulated film, etc.), which can be chosen based on the particular end application.

In certain embodiments of the various aspects of the composition described herein, the composition further includes scatterers.

Scatterers, also referred to as scattering agents, within the scope of the disclosure may be present, for example, in an amount of between about 0.01 weight percent and about 1 weight percent. Amounts of scatterers outside such range may also be useful. Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the relevant art. The size and size distribution can be based upon the refractive index mismatch of the scattering particle and the host material in which the light scatterers are to be dispersed, and the preselected wavelength(s) to be scattered according to light scattering theory, e.g., Rayleigh or Mie scattering theory. The surface of the scattering particle may further be treated to improve dispersibility and stability in the host material. Such surface treatments can be organic or inorganic, e.g. silica coating on a titania particle, such as available for purchase at Evonik. In one embodiment, the scattering particle comprises TiO$_2$ (R902+ from DuPont) having a 0.405 µm median particle size in a concentration in a range from about 0.01 to about 1% by weight.

The amount of scatterers in a formulation is useful in applications where the formulation which may be in the form of an ink is contained in a clear vessel having edges to limit losses due the total internal reflection. The amount of the scatterers may be altered relative to the amount of semiconductor nanocrystals used in the formulation. For example, when the amount of the scatter is increased, the amount of semiconductor nanocrystals may be decreased.

Other optional additives or ingredients can also be included in a composition. In certain embodiments, a composition can further include one or more photo initiators. In certain embodiments, a composition can further include one or more cross-linking agents. In certain embodiments, a composition can further include one or more thixotropes. One of skill in the art will readily recognize from the present invention that additional additives or ingredients at suitable amounts can be selected from known or commercially available additives and ingredients and included within a formulation depending upon the particular intended application for the semiconductor nanocrystals and composition.

The present invention includes compositions including one or more semiconductor nanocrystals described herein and other products including one or more semiconductor nanocrystals described herein. Examples of such compositions and/or products include, but are not limited to, light emitting materials, color-converting materials, optical materials, inks, paints, taggants, optical components, backlighting units, displays, electronic devices, opto-electronic devices, light-emitting devices, color-converting materials, lamps, light bulbs, luminaires, etc. In certain embodiments of such compositions, the one or more semiconductor nanocrystals can be a constituent of a composition, that may include one or more other ingredients. In certain embodiments of such other products, the one or more semiconductor nanocrystals can be included in a composition included in the other product and/or included in a component part of the other product.

Embodiments of the invention include a light emitting device including a light emitting material comprising at least one semiconductor nanocrystal described herein.

Embodiments of the invention include a light emitting device comprising an inorganic semiconductor light emitting diode wherein at least one semiconductor nanocrystal described herein is arranged to receive and convert at least a portion of light emitted by the light-emitting diode from a first emission wavelength to one or more predetermined wavelengths. One or more of such light-emitting devices can be further included in a lighting fixture or system. In further embodiments, a light emitting device can include a different type of light source in lieu of an inorganic semiconductor light emitting diode.

Embodiments of the invention also include a light-emitting device comprising a light-emitting element and an optical material including at least one semiconductor nanocrystal described herein arranged to receive and convert at least a portion of light emitted by the light emitting element from a first emission wavelength to one or more predetermined wavelengths, wherein the optical material comprises a composition taught herein.

In certain embodiments, the optical material can encapsulate at least the light emitting-surface of the light-emitting element. In certain embodiments, the optical material can be spaced from the light emitting-surface of the light-emitting element. In certain of such embodiments, the optical material can be included in the light-emitting device in the form of an optical component.

Embodiments of the invention also include display including a backlight member including a plurality of light-emitting diodes and an optical material arranged to receive and convert at least a portion of light emitted by at least a portion of the light-emitting diodes from a first emission wavelength to one or more predetermined wavelengths, wherein the optical material comprises a composition taught herein.

In certain embodiments, the display comprises a liquid crystal display.

In accordance with another aspect of the present invention, there is provided a method for preparing semiconductor nanocrystals comprising: introducing one or more first shell chalcogenide precursors and one or more first shell metal precursors to a reaction mixture including semiconductor nanocrystal cores, wherein the first shell chalcogenide precursors are added in an amount greater than the first shell metal precursors by a factor of at least about 2 molar equivalents and reacting the first shell precursors at a first reaction temperature of at least 300° C. to form a first shell on the semiconductor nanocrystal cores.

In certain preferred embodiments, the first shell chalcogenide precursors are added in an amount greater than the first shell metal precursors by a factor from about 2 to about 8 molar equivalents.

In certain embodiments, a first shell chalcogenide precursor comprises an alkanethiol precursor. Examples of alkanethiol precursors include, but are not limited to, octanethiol, dodecanethiol, hexadecanethiol, etc. In certain embodiments, dodecanethiol can be a preferred sulfur precursor.

Examples of other chalcogenide precursors include, but are not limited to, trialkyl phosphine selenides such as (tri-n-octylphosphine) selenide (TOPSe) or (tri-n-butylphosphine) selenide (TBPSe), dialkyl phosphine selenides such as di-iso-butylphosphine-selenide (DiBPSe), bis(trimethylsilyl) selenide ((TMS)$_2$Se), octadecene-Se, trialkyl phosphine tellurides such as (tri-n-octylphosphine) telluride (TOPTe); dialkyl phosphine tellurides such as di-iso-butylphosphine telluride (DiBPTe), hexapropylphosphorustriamide telluride (HPPTTe), bis(trimethylsilyl)telluride ((TMS)$_2$Te), octadecene-Te.

In certain embodiments, a first shell metal precursor comprises a metal carboxylate.

A preferred example includes zinc oleate (Zn(Oleate)$_2$).

In certain preferred embodiments, the first reaction temperature is from 300° C. to 360° C.

In certain of such embodiments, the first shell is applied at a temperature in excess of 300° C. for a time of 2 minutes up to 30 minutes. Times may be varied outside of this range, depending upon the particular precursors.

Semiconductor nanocrystal cores preferably comprise an inorganic semiconductor material.

Examples of semiconductor materials that can be included in a semiconductor nanocrystal core include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

In certain preferred embodiments, semiconductor nanocrystal cores comprise cadmium selenide.

In certain embodiments, the first shell comprises a first semiconductor material and has a thickness greater than or equal to the thickness of 1 monolayer of the first semiconductor material.

In certain embodiments, the first shell comprises a first semiconductor material and has a thickness up to the thickness of about 10 monolayers of the first semiconductor material.

In certain preferred embodiments, the semiconductor nanocrystal core is prepared in accordance with the method described in U.S. Patent Application No. 61/562,465, filed 22 Nov. 2011, of Liu, et al., for "Method Of Making Quantum Dots", which is hereby incorporated herein by reference in its entirety.

In certain of such preferred embodiments, the method further includes a first step for preparing semiconductor cores, the first step comprising combining one or more highly reactive first chalcogenide precursors, one or more highly reactive first metal precursors, and a seed stabilizing agent at a reaction temperature to form a reaction mixture where the ratio of metal to chalcogenide is in a range from 1 to 0.5 to 1 to 1, quenching the reaction mixture resulting in semiconductor nanocrystal cores. In certain of such embodiments, a first highly reactive chalcogenide precursor comprises secondary phosphine chalcogenide precursor and a first highly reactive metal precursor comprises a metal carboxylate. In certain embodiments, cadmium oleate (Cd(Oleate)$_2$) is preferred. In certain embodiments, the seed stabilizing agent comprises a phosphonic acid. In certain embodiments, octadecylphosphonic acid is preferred. The reaction temperature for forming the cores is preferably sufficient for forming the semiconductor nanocrystal cores. For example, a preferred reaction temperature for preparing a semiconductor nanocrystal core comprising CdSe is about 270° C. Preferably, when the reaction is quenched, there are no unreacted first metal precursors or first phosphine chalcogenide precursor in the reaction mixture including the cores.

Most preferably, the cores are stable with respect to maintaining its absorbance peak Half Width at Half Maximum (HWHM), and peak position to within 5 nm of its starting wavelength upon heating up to high temperature (250° C.-320° C.) for a period of up to 30 minutes.

The method can further comprise introducing one or more second shell chalcogenide precursors and one or more second shell metal precursors to the reaction mixture including semiconductor nanocrystal cores including the first shell at a second reaction temperature of at least 300° C., wherein the second shell chalcogenide precursors are added in an amount of at least 0.7 molar equivalents of the second shell metal precursors, and reacting the second shell precursors to form a second shell over the first shell on the semiconductor nanocrystal cores.

In certain preferred embodiments, the second shell chalcogenide precursors are added in an amount of 0.7 to 10 molar equivalents of the second shell metal precursors. Amounts outside of this range can be used, depending on the nature of the particular precursor used.

In certain embodiments, a second shell chalcogenide precursor comprises an alkanethiol precursor. Examples of alkanethiol precursors include, but are not limited to, octanethiol, dodecanethiol, hexadecanethiol, etc. In certain embodiments, dodecanethiol can be a preferred sulfur precursor.

Examples of other chalcogenide precursors include, but are not limited to, trialkyl phosphine selenides such as (tri-n-octylphosphine) selenide (TOPSe) or (tri-n-butylphosphine) selenide (TBPSe), dialkyl phosphine selenides such as di-iso-butylphosphine-selenide (DiBPSe), bis(trimethylsilyl) selenide ((TMS)$_2$Se), octadecene-Se, trialkyl phosphine tellurides such as (tri-n-octylphosphine) telluride (TOPTe); dialkyl phosphine tellurides such as di-iso-butylphosphine telluride (DiBPTe), hexapropylphosphorustriamide telluride (HPPTTe), bis(trimethylsilyl)telluride ((TMS)$_2$Te), octadecene-Te.

In certain embodiments, a second shell metal precursor comprises a metal carboxylate. Preferred examples include, but are not limited to, zinc oleate (Zn(Oleate)$_2$) and/or cadmium oleate (Cd(Oleate)$_2$).

In certain preferred embodiments, the second reaction temperature is preferably at least 315° C.

In certain embodiments, the second reaction temperature can be in a range from 315° C. to 360° C. Temperature may be varied outside of this range, depending upon the particular precursors.

In certain more preferred embodiments, the second shell is formed by controlled addition of second shell precursors over a period from 10 minutes up to 2 hours. Times may be varied outside of this range, depending upon the particular precursors.

In certain embodiments, the second shell comprises a second semiconductor material and has a thickness greater than or equal to the thickness of 3 monolayers of the second semiconductor material.

In certain embodiments, the second shell has a thickness up to the thickness of about 20 monolayers of the second semiconductor material.

In certain embodiments, the first shell comprises zinc sulfide, and the second shell comprises one or more metals wherein the one or metals comprises from 0 to less than 100% cadmium.

In certain embodiments, the core comprises CdSe, the first shell comprises ZnS at a thickness of about 3-4 monolayers of ZnS, and the second shell comprises $Cd_{1-x}Zn_xS$ wherein $0<x\leq1$ at a thickness of about 9-10 monolayers of $Cd_{1-x}Zn_xS$.

In an example of a preferred embodiment of a semiconductor nanocrystal with peak emission at a wavelength in a range from 600 nm to 635 nm, the first shall can comprise a thickness of about 3.66 monolayers of the material constituting the first shell and the second shell can have a thickness of about 9.5 monolayers of the material constituting the second shell.

In certain preferred embodiments of the methods described herein, the semiconductor nanocrystal core and shells are undoped.

In accordance with another aspect of the present invention, there is provided a population of semiconductor nanocrystals prepared in accordance with a method described herein.

In accordance with another aspect of the present invention, there is provided a population of overcoated semiconductor nanocrystals prepared in accordance with a method described herein.

The present invention also includes compositions including one or more semiconductor nanocrystals prepared by any of the methods described herein and other products including one or more semiconductor nanocrystals described herein. Examples of such compositions and/or products include, but are not limited to, light emitting materials, color-converting materials, inks, paints, taggants, optical components, backlighting units, displays, electronic devices, opto-electronic devices, light-emitting devices, color-converting materials, lamps, light bulbs, luminaires, etc. In certain embodiments of such compositions, the one or more semiconductor nanocrystals can be a constituent of a composition, that may include one or more other ingredients. In certain embodiments of such other products, the one or more semiconductor nanocrystals can be included in a composition included in the other product and/or included in a component part of the other product.

Embodiments of the invention include a light emitting device including a light emitting material comprising at least one semiconductor nanocrystal prepared by any of the methods described herein.

Embodiments of the invention include a light emitting device comprising an inorganic semiconductor light emitting diode wherein at least one semiconductor nanocrystal prepared by any of the methods described herein is arranged to receive and convert at least a portion of light emitted by the light-emitting diode from a first emission wavelength to one or more predetermined wavelengths. One or more of such light-emitting devices can be further included in a lighting fixture or system. In further embodiments, a light emitting device can include a different type of light source in lieu of an inorganic semiconductor light emitting diode.

Embodiments of the invention also include a light-emitting device comprising a light-emitting element and an optical material including at least one semiconductor nanocrystal prepared by any of the methods described herein arranged to receive and convert at least a portion of light emitted by the light emitting element from a first emission wavelength to one or more predetermined wavelengths, wherein the optical material comprises a composition taught herein.

In certain embodiments, the optical material can encapsulate at least the light emitting-surface of the light-emitting element. In certain embodiments, the optical material can be spaced from the light emitting-surface of the light-emitting element. In certain of such embodiments, the optical material can be included in the light-emitting device in the form of an optical component.

Embodiments of the invention also include display including a backlight member including a plurality of light-emitting diodes and an optical material arranged to receive and convert at least a portion of light emitted by at least a portion of the light-emitting diodes from a first emission wavelength to one or more predetermined wavelengths, wherein the optical material comprises a composition taught herein.

In certain embodiments, the display comprises a liquid crystal display.

In accordance with another aspect of the present invention, there is provided a color-converting material comprising a semiconductor nanocrystal prepared in accordance with a method described herein.

In accordance with another aspect of the present invention, there is provided a lamp comprising a semiconductor nanocrystal prepared in accordance with a method described herein.

In accordance with another aspect of the present invention, there is provided a light bulb including a semiconductor nanocrystal prepared in accordance with a method described herein.

In accordance with another aspect of the present invention, there is provided a luminaire including a semiconductor nanocrystal prepared in accordance with a method described herein.

The present invention will be further clarified by the following examples, which are intended to be exemplary of the present invention.

EXAMPLES

Example 1

Following is an example of a preferred embodiment of a method in accordance with the present invention:

Example 1A

Semiconductor Nanocrystals Capable of Emitting Red Light

Figure 5A:
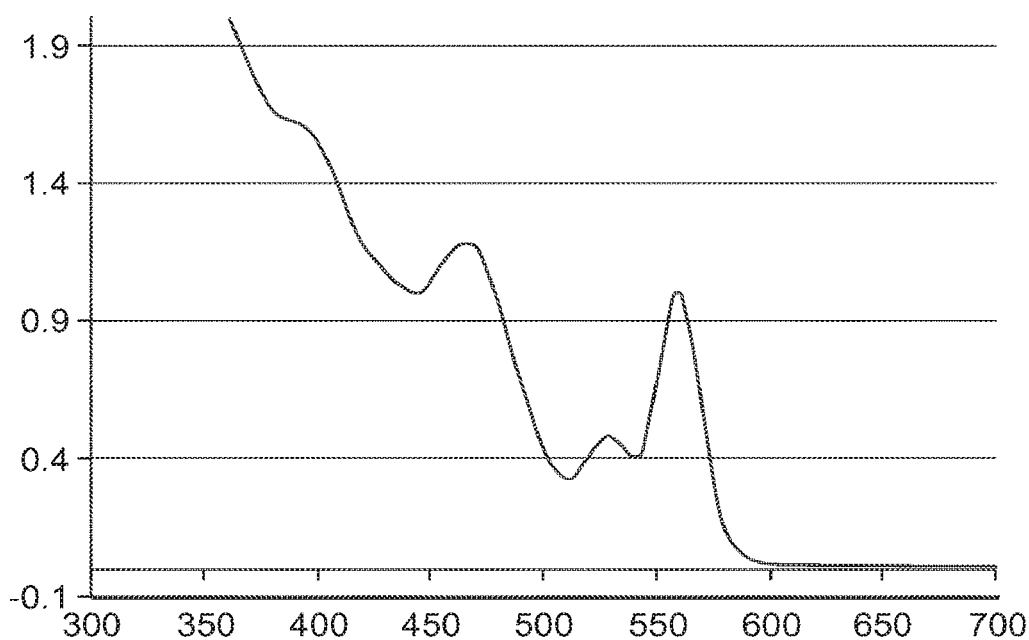
FIGS. 5A and 5B graphically illustrate Absorption spectra referred to in Examples 1A and 1B.

Synthesis of CdSe Cores:

The following are added to a 1 L glass reaction vessel: trioctylphosphine oxide (17.10 g), 1-octadecene (181.3 g), 1-octadecylphosphonic acid (2.09, 24.95 mmol), and Cd(Oleate)$_2$ (1 M solution in trioctylphosphine, 24.95 mL, 24.95 mmol). The vessel is subjected to 3 cycles of vacuum/nitrogen at 120° C., and the temperature is raised to 270° C. under nitrogen. At 270° C., a solution of 1 M diisobutylphosphine selenide in N-dodecylpyrrolidone (DIBP-Se, 19.46 mL, 19.46 mmol) is rapidly injected, within a period of less than 1 second, followed by injection of 1-octadecene (76.6 mL) to rapidly drop the temperature to about 240° C. resulting in the production of quantum dots with an initial absorbance peak between 420-450 nm. 5-20 seconds after the ODE quench, a solution of Cd(Oleate)$_2$ (0.5 M in a 50/50 v/v mixture of TOP and ODE) is continuously introduced along with a solution of DIBP-Se (0.4 M in a 60/40 v/v mixture of N-dodecylpyrrolidone and ODE) at a rate of 61.7 mL/hr. At 15 min, the infusion rate is increased to 123.4 mL/hr. At 25 min, the infusion rate is increased to 185.2 mL/hour. At 35 min, the infusion rate is increased to 246.9 mL/hr. At 45 min, the infusion rate is increased to 329.2 mL/hr. A total of 136.8 mL of each precursor is delivered while the temperature of the reactor is maintained between 215-240° C. At the end of the infusion, the reaction vessel is cooled using room temperature airflow over a period of 5-15 min. The final material is used as is without further purification (First absorbance peak: 559 nm, Total volume: 587 mL, Reaction yield: 99%). The absorption spectrum of the core is shown in FIG. 5A.

Figure 6A:
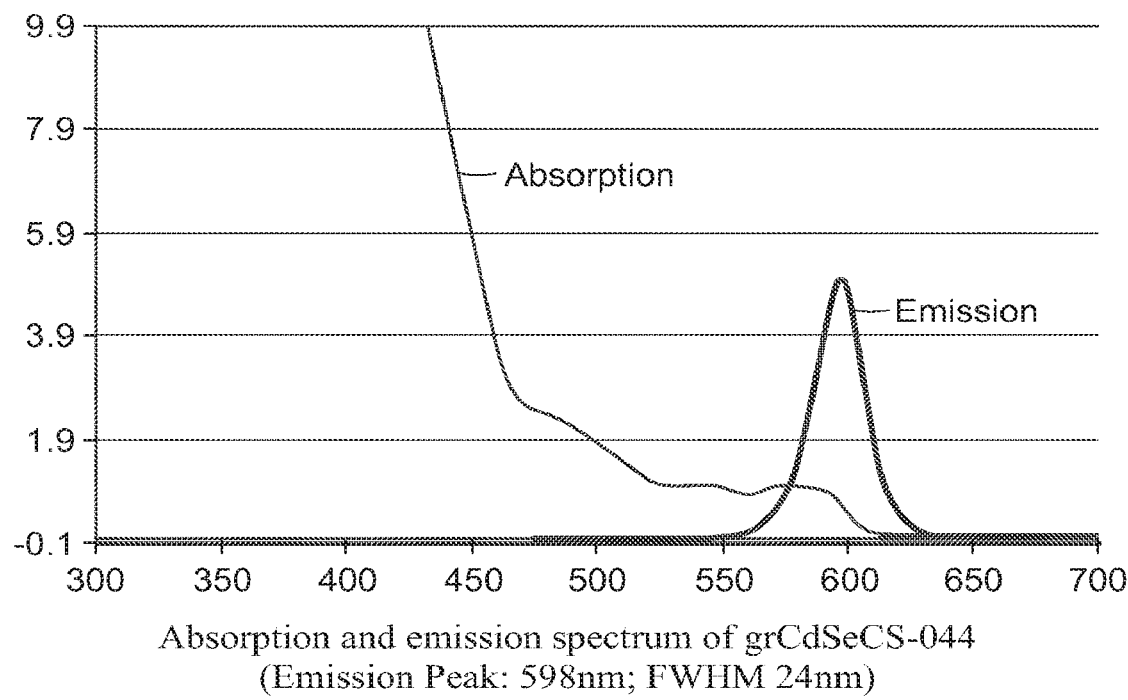
FIGS. 6A and 6B graphically illustrate absorption and emission spectra referred to in Examples 1A and 1B.

Synthesis of CdSe/ZnS/CdZnS Core/Shell/Shell:

CdSe cores synthesized as described in the preceding paragraph, with a first absorbance peak of 559 nm (72.9 mL, 8 mmol Cd), are mixed with Zn(Oleate)$_2$ (44.0 mL, 0.5 M in TOP) and 1-octadecene (84.1 mL). The solution is heated to 320° C., upon which a syringe containing 1-dodecanethiol (39.54 mL) is swiftly injected. After 2 min, when the temperature recovers to 310-315° C., the overcoat precursors are delivered via a syringe pump over a period of 30 min. The two overcoating precursor stocks include the following: 1) Zn(Oleate)$_2$ (53.87 mL, 0.5 M in TOP) mixed with Cd(Oleate)$_2$ (64.64 mL, 1.0 M in TOP), and 2) dodecanethiol (33.69 mL) mixed with 1-octadecene (67.86 mL)

and TOP (16.96 mL). During the overcoating precursor infusion, the temperature is kept between 320° C.-330° C. Any volatiles from the system are allowed to distill over and leave the system in order for the temperature to reach 320-330 C. After the infusion ends, the sample is annealed for 5 min at 320-330° C. and cooled to room temperature over a period of 5-15 min. The final core/shell material is precipitated via the addition of butanol and methanol at a 2:1 ratio v/v. The pellet is isolated via centrifugation, and redispersed into toluene (10 mL) for storage (Emission 598 nm, FWHM 24 nm, Film EQE at RT: 99%, Film EQE at 140° C.: 90-94%). The absorption and emission spectrum are shown in FIG. 6A.

Example 1b

Semiconductor Nanocrystals Capable of Emitting Green Light

Figure 5B:
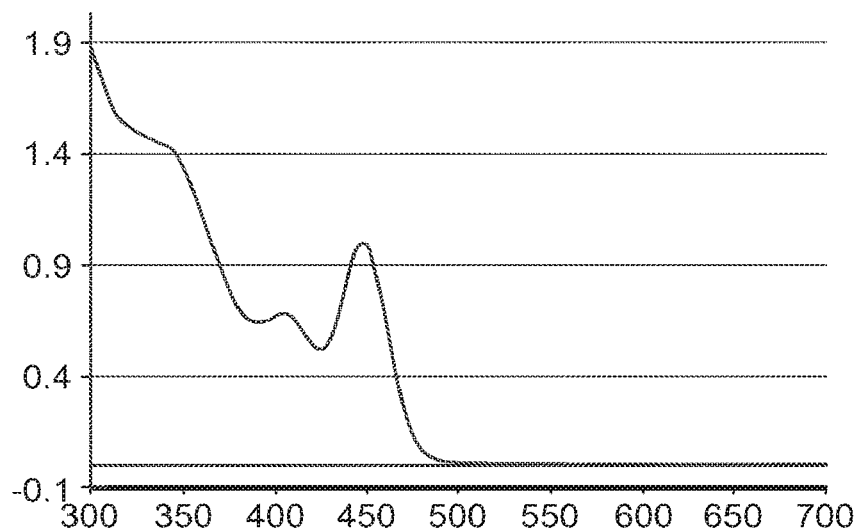

Synthesis of CdSe Cores (448 nm Target):

The following are added to a 1 L steel reaction vessel: trioctylphosphine oxide (51.88 g), 1-octadecene (168.46 g), 1-octadecylphosphonic acid (33.09 g, 98.92 mmol), and $Cd(Oleate)_2$ (1M solution in trioctylphosphine, 98.92 mL, 98.92 mmol). The vessel is subjected to 3 cycles of vacuum/nitrogen at 120° C., and the temperature is raised to 270° C. under nitrogen. At 270° C., a solution of 1M diisobutylphosphine selenide in N-dodecylpyrrolidone (DIBP-Se, 77.16 mL, 77.16 mmol) is rapidly injected, within a period of less than 1 second, followed by injection of 1-octadecene (63.5 mL) to rapidly drop the temperature to about 240° C. resulting in the production of quantum dots with an initial absorbance peak between 420-430 nm. 5-20 seconds after the ODE injection, a solution of $Cd(Oleate)_2$ (0.5 M in a 50/50 v/v mixture of TOP and ODE) is continuously introduced along with a solution of DIBP-Se (0.4 M in a 60/40 v/v mixture of N-dodecylpyrrolidone and ODE) at a rate of 29.0 mL/min. A total of 74.25 mL of each precursor is delivered while the temperature of the reactor is maintained between 205-240° C. At the end of the infusion, the reaction vessel is cooled rapidly by immersing the reactor in a squalane bath chilled with liquid nitrogen to rapidly bring the temperature down to <150° C. (within 2 minutes). The final material is used as is without further purification (First absorbance peak: 448 nm, Total volume: 702 mL, Reaction yield: 99%). The absorption spectrum of the core is shown in FIG. 5B.

Synthesis of CdSe/ZnS/CdZnS Core/Shell/Shell

Figure 6B:
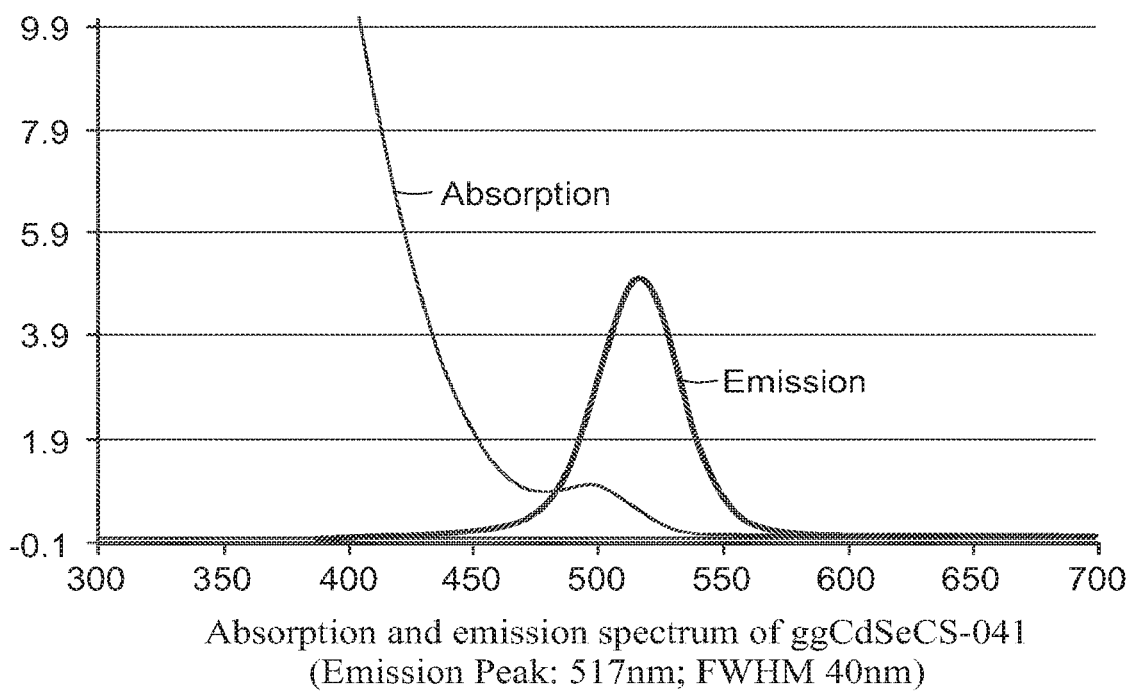

CdSe cores synthesized as described in the preceding paragraph, with a first absorbance peak of 448 nm (47.61 mL, 7.74 mmol Cd), are mixed with dodecanethiol (30.67 mL) in a syringe. A reaction flask containing $Zn(Oleate)_2$ (128.0 mL, 0.5 M in TOP) is heated to 300° C., upon which the syringe containing cores and 1-dodecanethiol is swiftly injected. When the temperature recovers to 310° C. (between 2-8 min), the overcoat precursors are delivered via a syringe pump over a period of 32 min. The two overcoating precursor stocks include the following: 1) $Zn(Oleate)_2$ (155.59 mL, 0.5M in TOP) mixed with $Cd(Oleate)_2$ (51.86 mL, 1.0 M in TOP), and 2) dodecanethiol (21.74 mL) mixed 1-octadecene (19.75 mL). During the overcoating precursor infusion, the temperature is kept between 320-330° C. Any volatiles from the system are allowed to distill over and leave the system in order for the temperature to reach 320-330° C. After the infusion ends, the sample is annealed for 3 min at 320-330° C. and cooled to room temperature over a period of 5-15 min. The final core/shell material is precipitated via the addition of butanol and methanol at a 2:1 ratio v/v. The pellet is isolated via centrifugation, and redispersed into toluene for storage (Emission 517 nm, FWHM 40 nm, Film EQE at RT: 99%, Film EQE at 140° C.: 85-90%). Absorption and emission spectrum is shown in FIG. 6B.

Example 2

Control Sample (Red)

Preparation of Semiconductor Nanocrystals Capable of Emitting Red Light with 3,5-di-tert-butyl-4-hydroxybenzylphosphonic acid Synthesis of CdSe Cores:

45.94 mmol cadmium acetate is dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid are added to a 0.5 L stainless steel reactor and dried and degassed at 140° C. for one hour. After degassing, the Cd solution is added to the reactor containing the oxide/acid and the mixture is heated to 270° C. under nitrogen. Once the temperature reaches 270° C., 425 mmol of aerated tri-n-butylphosphine (see preparation below) is injected into the flask. The temperature of the mixture is then raised to 305° C. where 105 mL of 1.5 M aerated TBP-Se (see preparation below) is then rapidly injected. The reaction is allowed to proceed for 8 minutes and 45 seconds (aliquots taken at 1 minute intervals to observe the growth and corresponding absorption wavelength shift) at which point the reactor is then immediately submerged in partially frozen (via liquid nitrogen) squalane bath rapidly reducing the temperature of the reaction to below 100° C. The first absorption peak of the nanocrystals is 557 nm. The CdSe cores are precipitated out of the growth solution inside a nitrogen atmosphere glovebox by adding a 3:1 mixture of methanol and isopropanol. The isolated cores are then dissolved in hexane and used to make core-shell materials.

Preparation of Aerated TBP-Se:

9.5 mol of TBP (Strem Lot A4329040) is loaded into a 3 L 3-neck round-bottom flask. A tank of dry compressed air is used to bubble dry air into the TBP at a rate of 4 L per minute (min). The temperature of the TBP is monitored during the aeration process.

| Elapsed Time (min) | Temperature (° C.) |
| --- | --- |
| 0 | 22.8 |
| 14 | 30.7 |
| 58 | 43.1 |
| 80 | 47.1 |
| 108 | 54.9 |
| 188 | 79.5 |

This aerated TBP is then combined with pure TBP (Strem 99%) in a ratio of 1:3 and then used as aerated TBP. The TBP-Se is made by mixing 105 mL of aerated TBP with 13.03 g of Se shot generating 1.5 M TBP-Se for use in the core preparation above.

Synthesis of Red Emitting CdSe/CdZnS Core-Shell Nanocrystals:

517.3 mmol of trioctylphosphine oxide and 48.3 mmol of 3,5-di-tert-butyl-4-hydroxybenzylphosphonic acid are loaded into a 0.5 L glass reactor. The mixture is then dried and degassed in the reactor by heating to 120° C. for about an hour. The reactor is then cooled to 70° C. and the hexane solution containing isolated CdSe cores (3.96 mmol Cd content) is added to the reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. The Cd/Zn (23.1 mmol and 23.1 mmol respectively) and S (23.1 mmol) samples are each dissolved in 40 mL of trioctylphosphine inside a nitrogen atmosphere glove box. Once the precursor solutions are prepared, the reaction flask is heated to 155° C. under nitrogen. The precursor solutions are added dropwise to the reactor at 155° C. at a rate of 20 mL per hour using a syringe pump. After the reaction proceeds for 1 hour, the precursor injection is stopped and the reaction temperature is allowed to return to room temperature. The nanocrystals are precipitated out of the growth solution by transferring to a 3:1 mixture of methanol and isopropanol and then isolating in a nitrogen atmosphere glovebox. The isolated core-shell nanocrystals are then dissolved in toluene. The specifications are as follows: Emission=612 nm; FWHM=32 nm; QY=81% in toluene.

Example 3

Control Sample (Green)

Preparation of Semiconductor Nanocrystals Capable of Emitting Green Light

Synthesis of ZnSe Cores:

7.0 mmol diethyl zinc is dissolved in 50 mL of tri-n-octylphosphine and mixed with 10 mL of 1 M TBP-Se. 0.374 mol of Oleylamine is loaded into a 250 mL 3-neck flask, dried and degassed at 90° C. for one hour. After degassing, the flask is heated to 310° C. under nitrogen. Once the temperature reaches 310° C., the Zn solution is injected and the reaction mixture is heated at 270° C. for 15-30 minutes while aliquots of the solution are removed periodically in order to monitor the growth of the nanocrystals. Once the first absorption peak of the nanocrystals reaches 350 nm, the reaction is stopped by dropping the flask temperature to 160° C. and the ZnSe core materials are used without further purification for preparation of CdZnSe cores.

Synthesis of CdZnSe Cores:

22.4 mmol dimethylcadmium is dissolved in 80 mL of tri-n-octylphosphine and mixed with 24 mL of 1 M TBP-Se. In a 1 L glass reactor, 0.776 mol of trioctylphosphine oxide and 42 mmol of octadecylphosphonic acid are loaded, dried and degassed at 120° C. for one hour. After degassing, the oxide/acid is heated to 160° C. under nitrogen and the entire ZnSe core reaction mixture (see above) is cannula transferred at 160° C. into the 1 L reactor, immediately followed by the addition of Cd/Se solution over the course of 20 minutes via syringe pump. The reaction mixture is then heated at 150° C. for 16-20 hours while aliquots of the solution are removed periodically in order to monitor the growth of the nanocrystals. The reaction is stopped by cooling the mixture to room temperature once the emission peak of the CdZnSe cores reaches 480 nm. The CdZnSe cores are precipitated out of the growth solution inside a nitrogen atmosphere glove box by adding a 2:1 mixture of methanol and n-butanol. The isolated cores are then dissolved in hexane and used to make core-shell materials.

Synthesis of CdZnSe/CdZnS Core-Shell Nanocrystals:

0.72 mol of trioctylphosphine oxide and 70 mmol of 3,5-di-tert-butyl-4-hydroxybenzylphosphonic acid are loaded into a 1 L glass reactor. The mixture is then dried and degassed in the reactor by heating to 120° C. for about an hour. The reactor is then cooled to 75° C. and the hexane solution containing isolated CdZnSe cores (2.74 mmol Cd content) is added to the reaction mixture. The hexane is removed under reduced pressure. Dimethyl cadmium, diethyl zinc, and hexamethyldisilathiane are used as the Cd, Zn, and S precursors, respectively. The Cd and Zn are mixed in a 3:10 ratio while the S is equimolar relative to Cd and Zn combined. The Cd/Zn (7.2/16.9 mmol of dimethylcadmium and diethylzinc) and S (24.2 mmol of hexamethyldisilathiane) samples are each dissolved in 40 mL of trioctylphosphine inside a nitrogen atmosphere glove box. Once the precursor solutions are prepared, the reactor is heated to 150° C. under nitrogen. The precursor solutions are added dropwise over the course of 2 hours at 150° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dissolved in hexane. The specifications are as follows: Emission=523 nm; FWHM=37 nm; QY=73% in toluene.

Example 4

Preparation of Ink Composition & Films

The following describes preparation of an ink formulation including semiconductor nanocrystals and preparation of a film from such ink formulation.

Example 4A

Preparation of Ink Formulation 10 mg of semiconductor nanocrystals (inorganic mass as determined via thermal gravimetric analysis (TGA)) in toluene is added to 1 mL of Ebecyl 150 and degassed under reduced pressure to remove the toluene and oxygen. Once the toluene is removed, three purge and $N_2$ back-fill cycles are completed and then 10 mg of $TiO_2$ is added to the formulation and the mixture is degassed under reduced pressure while stirring in order to disperse the $TiO_2$. Once these steps are completed, 1 drop (~12 mg) of Irgacure 2022 is added to the formulation and the mixture is stirred under air for a few minutes. The formulation is then ready for film preparation.

Example 4B

Preparation of Film

A film prepared from an ink formulation prepared as generally described in Example 4A is prepared as follows. ~5-10 µL of the formulation is dropped onto a 15 mm diameter borosilicate glass disc (~230+/−20 um in thickness). A second 15 mm disk is set on top of the drop of formulation sandwiching the ink between the glass slides. Care is taken to minimize the amount of ink at the edges that is not completely sandwiched by the glass slides. The sandwich is then brought into a $N_2$ purge box and inserted into a UV curing station (Dymax 5000-EC Series UV Curing Flood Lamp System) and cured with the following curing conditions: Dymax Metal Halide "D" Bulb; Part #38560;

80-100 milliWatts (mW)/square centimeter (cm$^2$) excitation power with a cure time of 10 seconds. Once the film is cured, the films are then irradiated with 25 mW/cm$^2$ of 450 nm LED light while on a hot plate set at 50° C. for 12-18 hrs. (Alternatively, the samples can be irradiated with approximately 100 mW/cm$^2$ of 450 nm LED light while on a hot plate set at 80° C. for 1 hour). After this process, the EQE of the film is measured in a QEMS (Labsphere product) integrating sphere system. The films are then ready for temperature dependent efficiency measurements.

Solid state photoluminescence external quantum efficiency (also referred to herein as "EQE" or "solid state photoluminescence efficiency) can be measured in an integrating sphere using a NIST traceable calibrated light source, using a method such as that developed by Mello et al., Advanced Materials 9(3):230 (1997), which is hereby incorporated by reference. Such measurements can also be made with a QEMS from LabSphere (which utilizes a 4 in sphere; e.g. QEMS-2000: World Wide Website laser2000.nl/upload/documenten/fop_21-en2.pdf).

Example 4C

PL Vs. Temperature Measurement Protocol

With the room temperature (25° C.) EQE measured in an integrating sphere (Example 4B), the sample is then measured on a hotplate at room temperature. The measurement involves optically exciting the sample at a wavelength shorter than the band edge absorption of the QDs (i.e. 1$^{st}$ excitonic absorption feature) and collecting both a portion of the PL emission from the sample as well as a portion of the excitation light after it interacts with the sample (this light is proportional to the absorption of the sample). The sample temperature is then raised via the hotplate and equilibrated at an elevated temperature for ~1 min (the temperature should not rise slower than 10° C./min) and the sample is then measured again. This process is repeated for multiple temperatures between 25° C. and about 140° C. or above. Measurements can be at preselected temperature intervals, e.g., at every 5, 10, or 20 degree intervals. Other intervals can be selected. The samples are heated and the measurements taken in the absence of oxygen. For each data point, the sample is held at a given temperature for about <~1-2 minutes when PL is measured. The EQE measurements were made using a 440 nm laser light source. Other adequate light sources include 405 nm laser or blue (405 and 440-450 nm) LED light sources. Monochromatic light from a white light monochromator can also be used. The light source should excite the sample with a flux/power density no greater than 100 mW/cm$^2$. Preferably, the excitation power density used to measure the sample is lower than that used to expose the sample prior to room temperature EQE measurement (as described in preparation of the film, Example 4B). The optical path of the system (both excitation light and emitted semiconductor nanocrystal light) is not altered during data collection.

Example 5

The EQE data presented in Table 1 and related figures are calculated based on the integrated PL change with temperature and correlated back to the room temperature (RT) EQE for the film. The integrated PL at RT is set equal to the RT measured EQE and therefore any change in PL is then an equivalent % change in EQE with adjustment for any absorption change at elevated temperatures.

The measurements used to calculate the values in Table 1 and the related figures are based on sample films prepared with the semiconductor nanocrystals of the invention (the film being prepared as generally described in Example 4 with nanocrystals prepared generally in accordance with the procedure described in Examples 1A (red) and 1B (green)) and control films (a red control film and a green control film prepared as generally described in Example 4 with semiconductor nanocrystals prepared generally in accordance with the procedure described in Example 2 (red) and Example 3 (green).

TABLE 1

| | EQE (%) at Temperature | | |
|---|---|---|---|
| | Temperature | | |
| Sample | 25° C. | 90° C. | 140° C. |
| Control (Red) | 81 | 75 | |
| Control (Green) | 81 | 68 | |
| Improved (Red) | 95 | 95 | 91 |
| Improved (Green) | 99 | 97 | 88 |

Figure 1B:
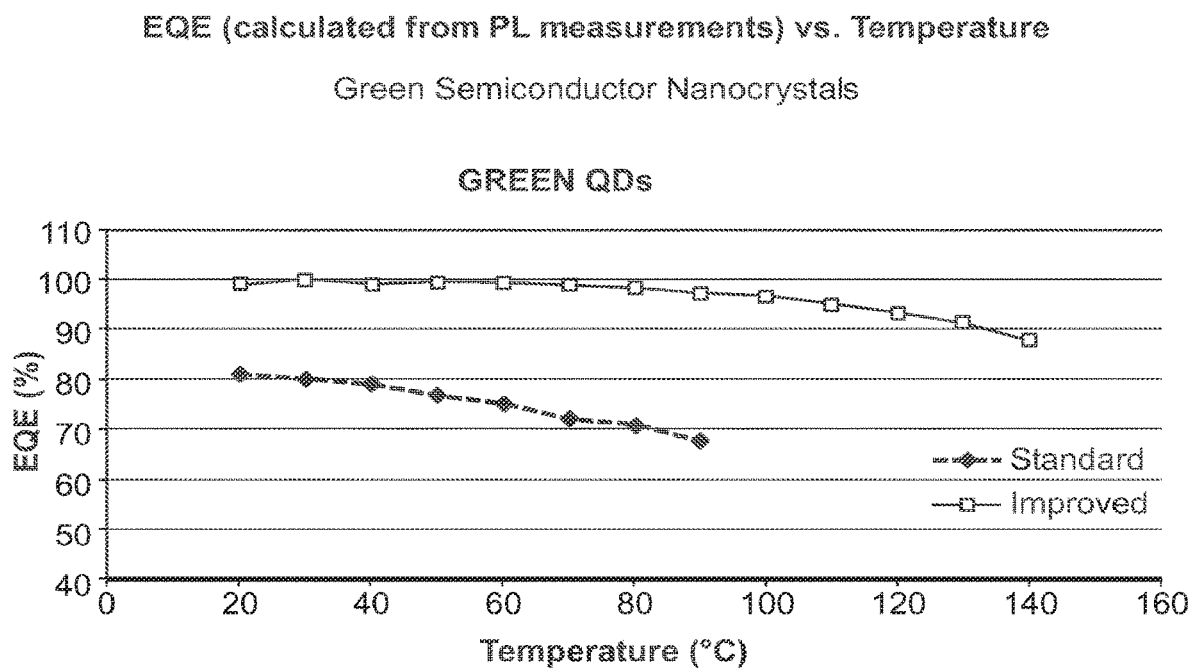

FIGS. 1A and 1B graphically depicts the calculated EQE values from Table 1 as a function of temperature.

As graphically shown in FIGS. 1A and 1B, the calculated EQE values for the semiconductor nanocrystal of the present invention, as preferably prepared in accordance with a method of the present invention are at least 10% higher at room temperature (e.g., 20° C.-25° C.) than the control (semiconductor nanocrystals of Examples 2 and 3), with the difference being greater with increasing temperature. While not wishing to be bound by theory, this illustrates a reduction in the quenching of semiconductor nanocrystal emission as a function of temperature (also referred to as "thermal quenching".)

Figure 2A:
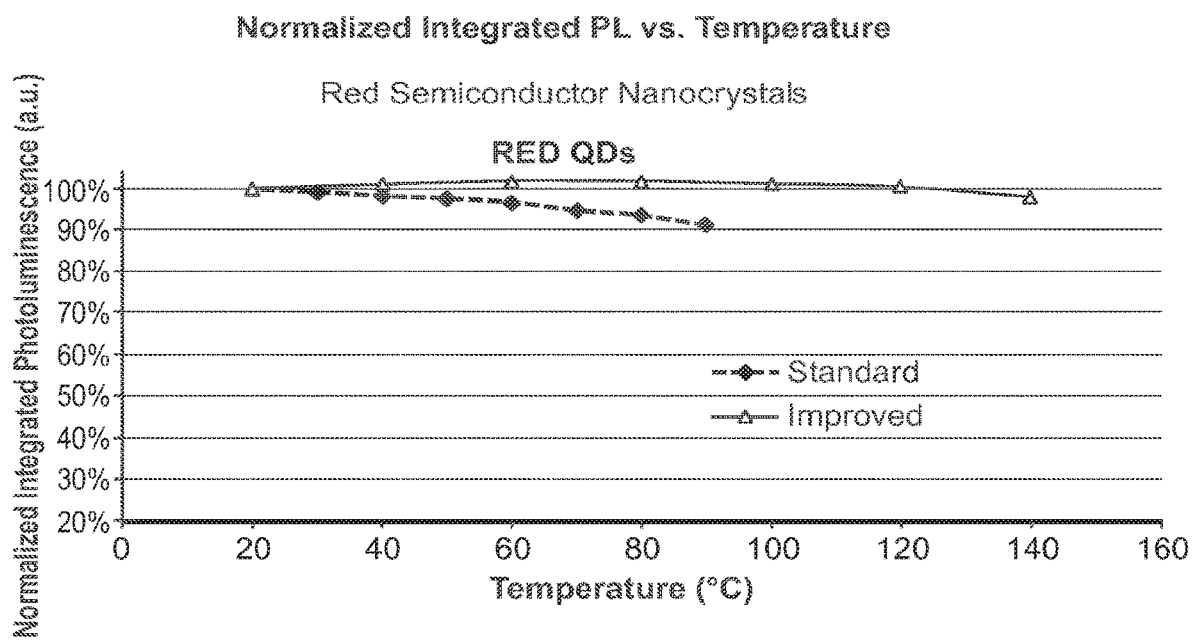
FIGS. 2A and 2B graphically illustrate a plot of integrated PL ($\Sigma_{PL}$) vs. temperature showing the % drop in PL vs. temperature for examples of embodiments of the present invention and for control samples.
Figure 2B:
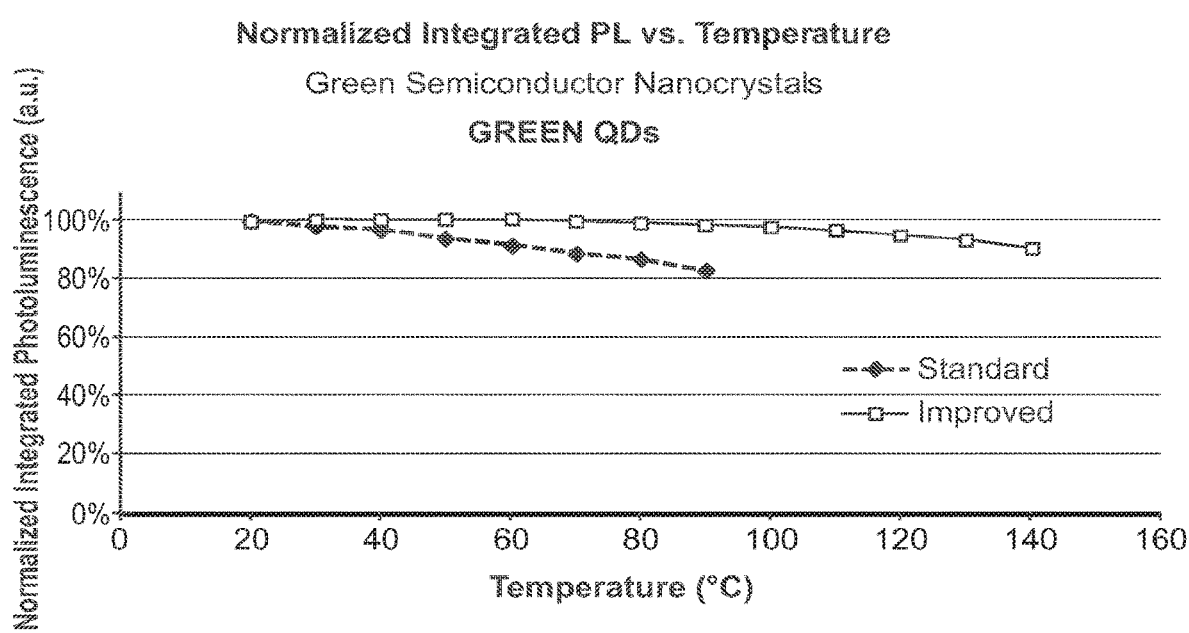

This result is further illustrated for the same samples in FIGS. 2A and 2B as a normalized integrated plot of PL versus temperature for semiconductor nanocrystals in accordance with the present invention, as preferably prepared in accordance with a method of the present invention, compared to the control semiconductor nanocrystals of Examples 2 and 3. FIGS. 2A and 2B show a % drop in PL vs. temperature for the comparative nanocrystals that is significantly greater than the drop observed for the nanocrystals of the present invention.

For assessing the EQE vs. temperature response of a semiconductor nanocrystal sample, a relative EQE measurement can be performed whereby the $\Sigma_{PL}$ values can be correlated back to the room temperature or starting EQE (EQE can be measured using DeMello's method in an integrating sphere). In other words, the $\Sigma_{PL}$ at room temp is set equal to the room temp EQE, and then the % drop in $\Sigma_{PL}$ at elevated temperatures, equates to an equivalent % drop from the room temperature EQE value. ($\Sigma_{PL}$ at RT is also referred to herein as I$_o$, and $\Sigma_{PL}$ at temperature T is also referred to herein as I(T).)

Example 6

Figure 3A:
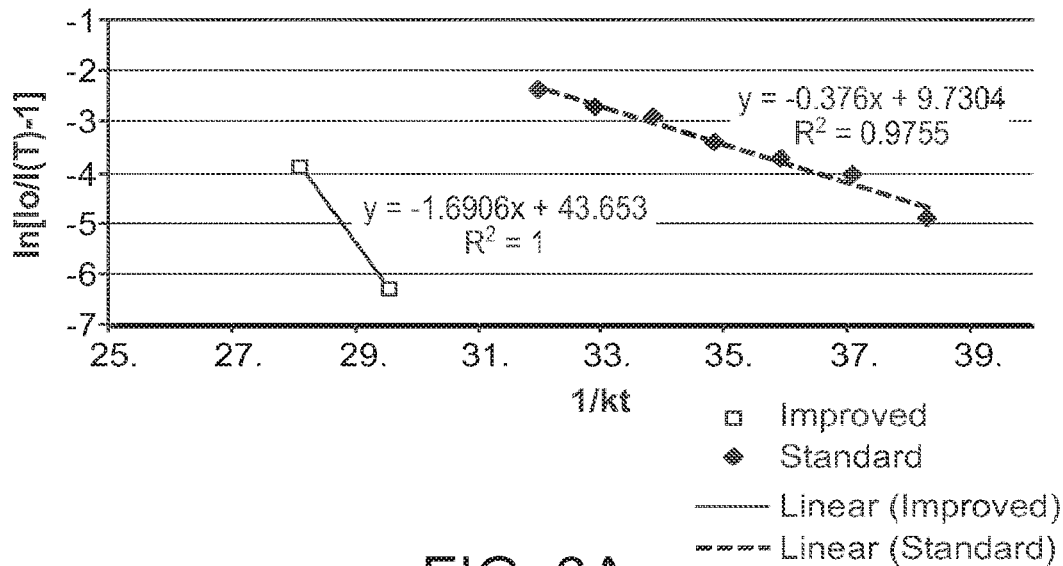
FIGS. 3A and 3B graphically illustrate $\ln[I_o/I(T)-1]$ vs. $1/kT$ for examples of embodiments of the present invention and for control samples.
Figure 3B:
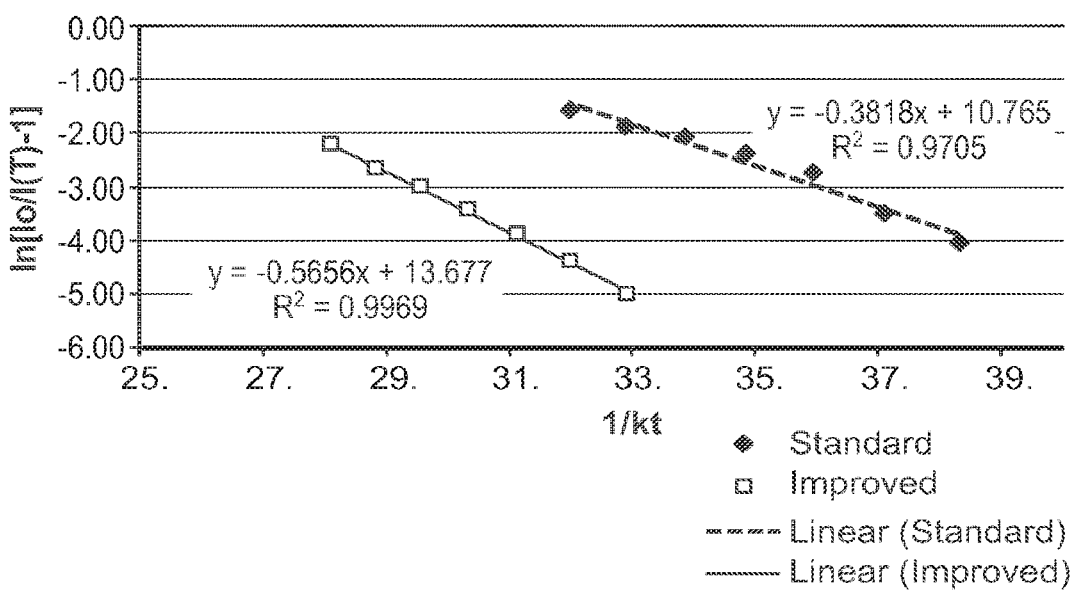

FIGS. 3A and 3B graphically show a plot prepared from PL data measured and collected for film samples described in Example 5. The data is plotted for ln[($\Sigma_{PL}$(T=Room Temp)/$\Sigma_{PL}$(T))−1] vs. 1/k$_B$T where k$_B$ is Boltzmann's constant (in eV) to assess the multi-LO phonon activation energy. Table 2, below, lists the activation energy values (in eV) as determined from the graphs in FIGS. 3A and 3B.

TABLE 2

Table of Activation Energies:

| | ACTIVATION ENERGY (EV) | |
| --- | --- | --- |
| | RED | GREEN |
| CONTROL | 0.38 | 0.38 |
| IMPROVED | 1.69 | 0.57 |

Example 7

Figure 4A:
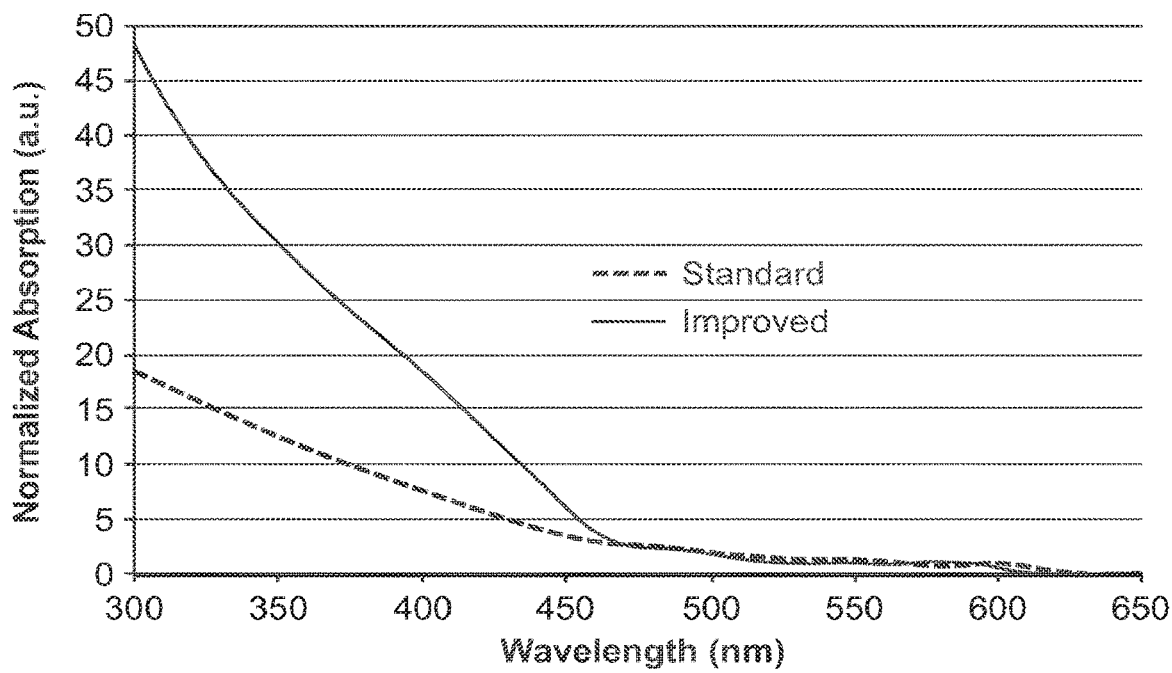
FIGS. 4A and 4B graphically illustrate absorption profiles and 325 nm/450 nm Ratios for examples of embodiments of the present invention and for control samples.
Figure 4B:
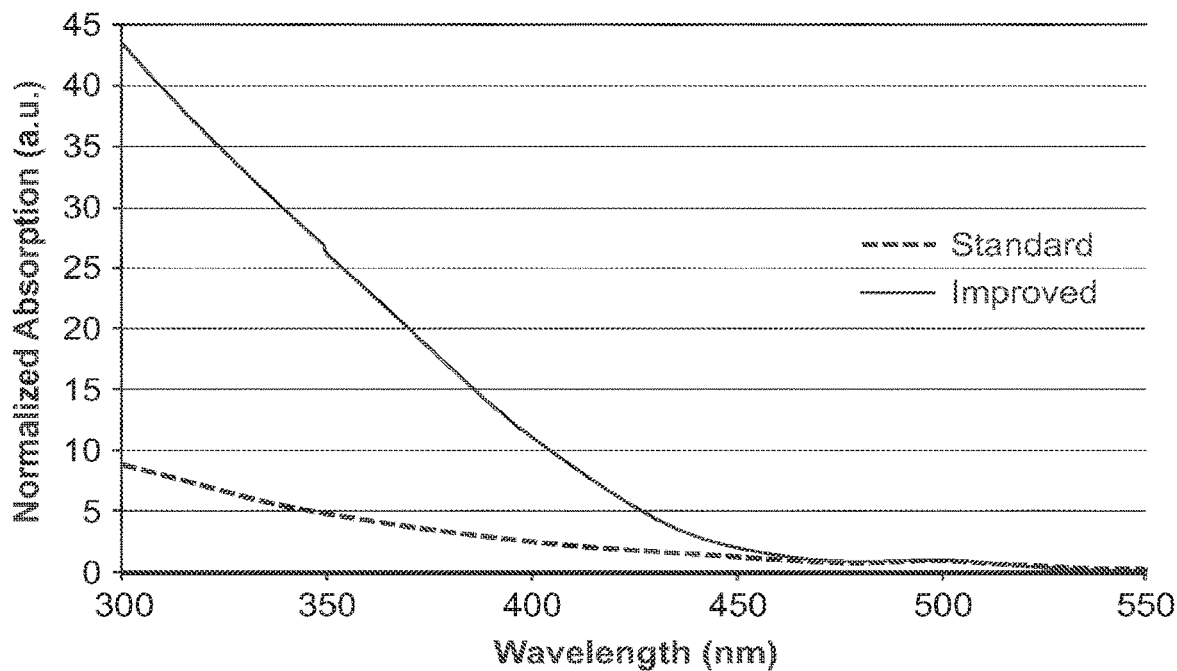

FIGS. 4A and 4B provide the absorption spectra measured on samples of semiconductor nanocrystals of Examples 1A and 1B (identified in Table 3 as "Improved") and of Examples 2 and 3 (identified in Table 3 as "Control"). The samples on which the measurements were taken were prepared by diluting 5 microliters of the particular semiconductor nanocrystal solution in 2.5 ml of solvent (hexane or toluene) such that the OD at 325 nm is less than 1. The spectrum of a sample is measured on the sample in a 1 cm quartz cuvette by an Agilent Cary 5000 UV-Vis-NIR absorbance spectrophotometer and normalized to the first excitonic peak. Table 3 below lists the Ratio of the absorption at 325 nm to the absorption at 450 nm for the four samples.

TABLE 3

Table of Abs Ratios* (325/450 nm):

| | ABS RATIO (325:450 NM) | |
| --- | --- | --- |
| | RED | GREEN |
| CONTROL | 4.5 | 5.4 |
| IMPROVED | 7.8 | 17.4 |

*Abs Ratio can be the ratio of OD or absorbance

Example 8

Control Sample (Red)

Preparation of Semiconductor Nanocrystals Capable of Emitting Red Light Using 2 Step Nucleation and Growth Core Method and High Temperature No Amine Overcoat Synthesis of CdSe Seed Cores:

45.94 mmol cadmium acetate is dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid are added to a 0.5 L stainless steel reactor and dried and degassed at 140° C. for one hour. After degassing, the Cd solution is added to the reactor containing the oxide/acid and the mixture is heated to 310° C. under nitrogen. Once the temperature reaches 310° C., the heating mantle is removed from the reactor and 139.9 mmol of diisobutylphosphine selenide (DIBP-Se) dissolved in 105 mL of 1-Dodecyl-2-pyrrolidinone (NDP) (1.5 M DIBP-Se) is then rapidly injected. The reactor is then immediately submerged in partially frozen (via liquid nitrogen) squalane bath rapidly reducing the temperature of the reaction to below 100° C. The first absorption peak of the nanocrystals is 476 nm. The CdSe cores are precipitated out of the growth solution inside a nitrogen atmosphere glovebox by adding a 3:1 mixture of methanol and isopropanol. The isolated cores are then dissolved in hexane and used in a growth process to make red CdSe cores.

Growth of CdSe Cores:

A 1 L glass reactor is charged with 320 mL of 1-octadecene (ODE) and degassed at 120° C. for 15 minutes under vacuum. The reactor is then backfilled with $N_2$ and the temperature set to 60° C. 82 mL of the CdSe seed core above is injected into the reactor and the hexanes are removed under reduced pressure until the vacuum gauge reading is <500 mTorr. The temperature of the reaction mixture is then set to 240° C. Meanwhile, two 50 mL syringes are loaded with 85 mL of cadmium oleate in TOP (0.5 M conc.) solution and another two syringes are loaded with 85 mL of di-iso-butylphosphine selenide (DiBP-Se) in TOP (0.5 M conc.). Once the reaction mixture reaches 240° C., the Cadmium oleate and DiBP-Se solutions are infused into the reactor at a rate of 40 mL/hr. The $1^{st}$ excitonic absorption feature of the CdSe cores is monitored during infusion and the reaction is stopped at 48 minutes when the absorption feature is 566 nm. The resulting CdSe cores are then ready for use as is in this growth solution for overcoating.

Synthesis of CdSe/ZnS/CdZnS Core-Shell Nanocrystals:

177 mL of the CdSe cores prepared as described in the preceding paragraph with a first absorbance peak at 566 nm are mixed in a 1 L reaction vessel with 1-octadecene (137 mL), and $Zn(Oleate)_2$ (0.5 M in TOP, 54 mL). The reaction vessel is heated to 120° C. and vacuum is applied for 15 min. The reaction vessel is then back-filled with nitrogen and heated to 310° C. The temperature is ramped, between 1° C./5 seconds and 1° C./15 seconds. Once the vessel reaches 300° C., octanethiol (23 mL) is swiftly injected and a timer started. Once the timer reaches 2 minutes., one syringe containing zinc oleate (0.5 M in TOP, 104 mL) and cadmium oleate (1 M in TOP, 85 mL), and another syringe containing octanethiol (88 mL) are swiftly injected. Once the timer reaches 30 minutes, the heating mantle is dropped and the reaction cooled by subjecting the vessel to a cool air flow. The final material is precipitated via the addition of butanol and methanol (4:1 ratio), centrifuged at 3000 RCF for 5 min, and the pellet redispersed into hexanes. The sample is then precipitated once more via the addition of butanol and methanol (3:1 ratio), centrifuged, and dispersed into toluene for storage (26.9 g of core/shell material, 618 nm emission, 28 nm FWHM, 93% quantum yield (QY), and 95% EQE in film).

Example 9

The EQE data presented in Table 4 and the related figure are calculated based on the integrated PL change with temperature and correlated back to the RT EQE. The integrated PL at RT is set equal to the RT measured EQE and therefore any change in PL is then an equivalent % change in EQE with adjustment for any absorption change at elevated temperatures.

The measurements used to calculate the values in Table 4 and the related figure are based on a sample film prepared with the semiconductor nanocrystals of the invention (the film being prepared as generally described in Example 4 with nanocrystals prepared generally in accordance with the procedure described in Examples 1A (red)) and a control film (the film being prepared as generally described in Example 4 with nanocrystals prepared generally in accordance with the procedure described in Example 8 (red)).

TABLE 4

EQE (%) v. Temperature
(FIG. 7)

| Sample | Temperature (T) | | | | | | |
|---|---|---|---|---|---|---|---|
| | 20° C. | 40° C. | 60° C. | 80° C. | 100° C. | 120° C. | 140° C. |
| Control (Red) | 89 | 88 | 87 | 84 | 79 | 70 | 60 |
| Improved | 95 | 95 | 95 | 95 | 94 | 94 | 91 |

Figure 7:
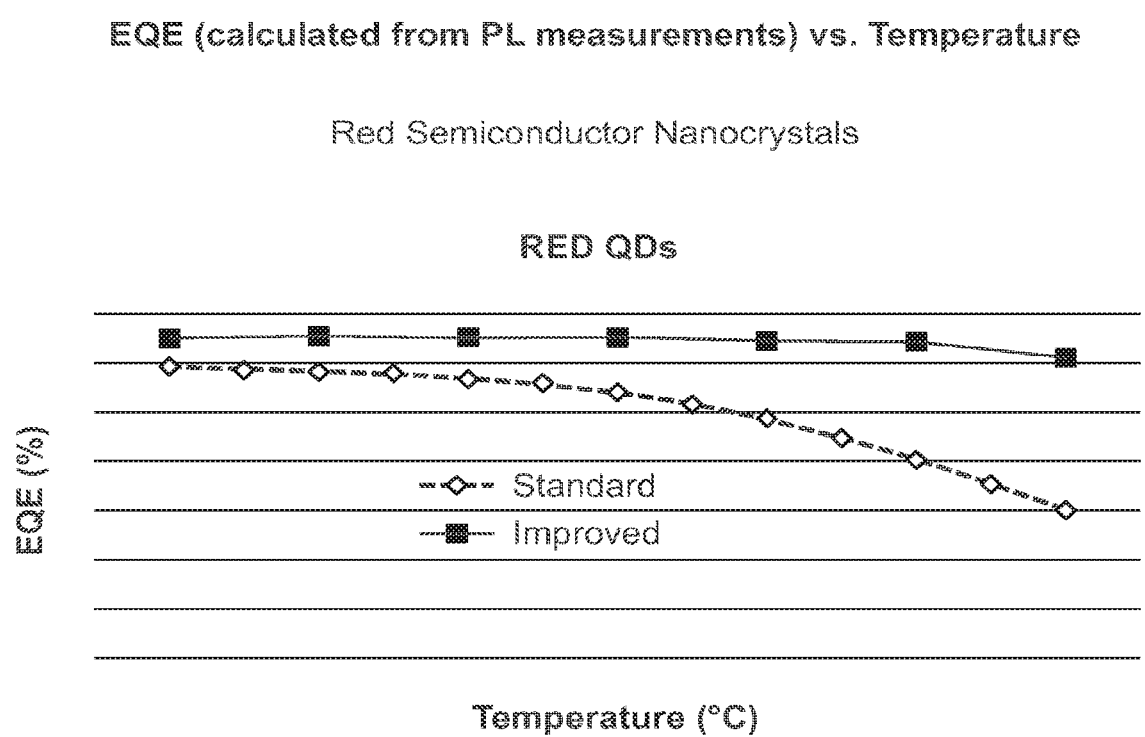
FIG. 7 graphically illustrate EQE (calculated from PL measurements) vs. Temperature for an example of an embodiment of the present invention and for a control sample.

FIG. 7 graphically depicts the calculated EQE values from Table 4 as a function of temperature.

As can be seen in FIG. 7, the calculated EQE values for the semiconductor nanocrystal of the present invention, as preferably prepared in accordance with a method of the present invention are at least 10% higher at room temperature (e.g., 20° C.-25° C.) than the control (semiconductor nanocrystals of Example 8), with the difference being greater with increasing temperature. This also illustrates a reduction in the quenching of semiconductor nanocrystal emission as a function of temperature.

Table 5 below compares the Ratio of the absorption at 325 nm to the absorption at 450 nm for the Improved samples of Example 7 with that for a control sample of semiconductor nanocrystals of Example 8.

TABLE 5

Table of Abs Ratios (325/450 nm):

| | ABS RATIO (325:450 NM) | |
|---|---|---|
| | RED | GREEN |
| CONTROL | 4.25 | (NONE) |
| IMPROVED | 7.8 | 17.4 |

As seen from the data presented in Table 6, Improved samples also show a notable increase in absorption (under excitation of 450 nm) at a temperature of 140° C. relative to the RT film absorption whereas the change in absorption of the Control sample is notably less. (A comparable change would be expected for the samples under excitation at <450 nm.)

TABLE 6

Absorption change at Temperature (%)

| Sample | Temperature | | |
|---|---|---|---|
| | 25° C. | 140° C. | Delta |
| Control (Red) | 86.85 | 87.17 | 0.32 |
| Improved (Red) | 65.92 | 68.28 | 2.36 |
| Improved (Green) | 79.81 | 83.19 | 3.38 |

In the attached Figures, information relating to a control sample is labeled "Standard" and information relating to a sample of an example of an embodiment of the present invention is labeled "Improved".

Example 10

Semiconductor Nanocrystals Capable of Emitting Green Light

Example 10A

Figure 8A:
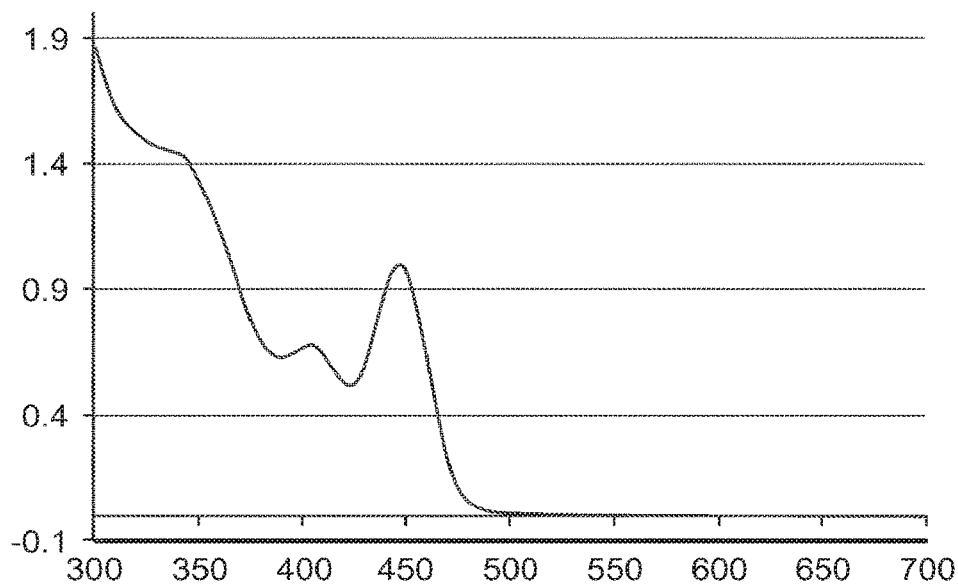
FIGS. 8A and 8B graphically illustrate absorption and emission spectra referred to in Examples 10A and 10B.

Synthesis of CdSe Cores (448 nm Target):

The following are added to a 1 L steel reaction vessel: trioctylphosphine oxide (51.88 g), 1-octadecene (168.46 g), 1-octadecylphosphonic acid (33.09 g, 98.92 mmol), and Cd(Oleate)$_2$ (1M solution in trioctylphosphine, 98.92 mL, 98.92 mmol). The vessel is subjected to 3 cycles of vacuum/nitrogen at 120° C., and the temperature is raised to 270° C. under nitrogen. At 270° C., a solution of 1M diisobutylphosphine selenide in N-dodecylpyrrolidone (DIBP-Se, 77.16 mL, 77.16 mmol) is rapidly injected, within a period of less than 1 second, followed by injection of 1-octadecene (63.5 mL) to rapidly drop the temperature to about 240° C. resulting in the production of quantum dots with an initial absorbance peak between 420-430 nm. 5-20 seconds after the ODE injection, a solution of Cd(Oleate)$_2$ (0.5M in a 50/50 v/v mixture of TOP and ODE) is continuously introduced along with a solution of DIBP-Se (0.4M in a 60/40 v/v mixture of N-dodecylpyrrolidone and ODE) at a rate of 29.0 mL/min. A total of 74.25 mL of each precursor is delivered while the temperature of the reactor is maintained between 205-240° C. At the end of the infusion, the reaction vessel is cooled rapidly by immersing the reactor in a squalane bath chilled with liquid nitrogen to rapidly bring the temperature down to <150° C. (within 2 minutes). The final material is used as is without further purification (First absorbance peak: 448 nm, Total volume: 702 mL, Reaction yield: 99%). The absorption spectrum of the core is shown in FIG. 8A.

Example 10B

Figure 8B:
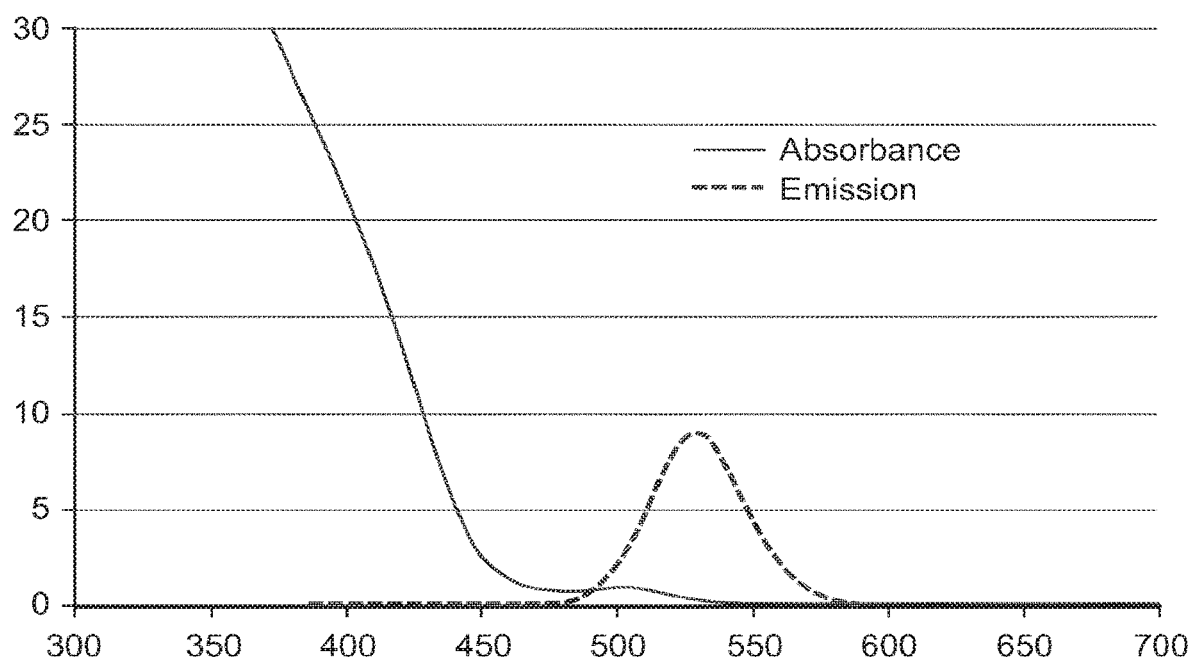

Synthesis of CdSe/ZnS/CdZnS Core/Shell/Shell:

CdSe cores synthesized as described in the preceding paragraph, with a first absorbance peak of 448 nm (27.70 mL, 4.78 mmol Cd), are mixed with dodecanethiol (23.76 mL, 99.20 mmol) in a syringe. A reaction flask containing Zn(Oleate)$_2$ (99.20 mL, 0.5M in TOP) is heated to 300° C., upon which the syringe containing cores and 1-dodecanethiol is swiftly injected. When the temperature recovers to 310° C. (between 2-8 min), the overcoat precursors are delivered via a syringe pump over a period of 32 min. The two overcoating precursor stocks include the following: 1) Zn(Oleate)$_2$ (141.25 mL, 0.5M in TOP, 70.63 mmol) mixed with Cd(Oleate)$_2$ (79.64 mL, 1.0M in TOP, 79.64 mmol), and 2) dodecanethiol (39.59 mL, 165.29 mmol) mixed 1-octadecene (3.67 mL) and n-trioctylphosphine (0.92 mL). During the overcoating precursor infusion, the temperature is kept between 320-330° C. Any volatiles from the system are allowed to distill over and leave the system in order for the temperature to reach 320-330° C. After the infusion ends, the sample is annealed for 3 minutes at 320-330° C. and cooled to room temperature over a period of 5-15 minutes. The final core/shell material is precipitated via the addition of butanol and methanol at a 2:1 ratio v/v. The pellet is isolated via centrifugation, and redispersed into toluene for storage (Emission 531 nm, FWHM 41 nm, Film EQE at RT: 99%, Film EQE at 140° C.: >90%). Absorption and emission spectra of the resulting overcoated nanocrystals are shown in FIG. 8B.

Example 11

Semiconductor Nanocrystals Capable of Emitting Red Light

Example 11A

Figure 9A:
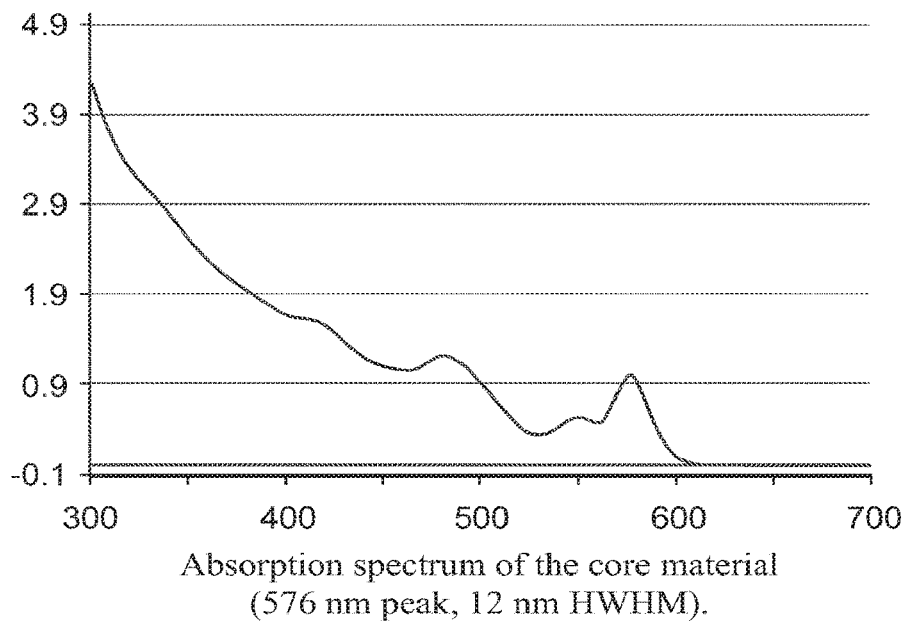
FIGS. 9A and 9B graphically illustrate absorption and emission spectra referred to in Examples 11A and 11B.

Synthesis of CdSe Cores:

The following are added to a 1 L glass reaction vessel: trioctylphosphine oxide (15.42 g), 1-octadecene (ODE, 225.84 g), 1-octadecylphosphonic acid (1.88 g, 5.63 mmol). The vessel is subjected to 3 cycles of vacuum/nitrogen at 120° C., and the temperature is raised to 270° C. under nitrogen. At 270° C., solutions of 0.25M diisobutylphosphine selenide in N-dodecylpyrrolidone (DIBP-Se, 17.55 mL, 4.3 8 mmol) and 0.25M Cd(Oleate)$_2$ in trioctylphosphine/ODE (22.50 mL, 5.62 mmol) are rapidly injected, within a period of less than 1 second, followed by injection of ODE (76.0 mL) to rapidly drop the temperature to about 240° C., resulting in the production of quantum dots with an initial absorbance peak between 420-450 nm. 5-20 seconds after the ODE quench, a solution of Cd(Oleate)$_2$ (0.5M in a 50/50 v/v mixture of TOP and ODE) is continuously introduced along with a solution of DIBP-Se (0.4M in a 60/40 v/v mixture of N-dodecylpyrrolidone and ODE) at a rate of 55.7 mL/hr. At 15 min, the infusion rate is increased to 111.4 mL/hr. At 25 min, the infusion rate is increased to 167.1 mL/hour. At 35 min, the infusion rate is increased to 222.8 mL/hr. At 45 min, the infusion rate is increased to 297.0 mL/hr. At 55 min, the infusion rate is increased to 396.0 mL/hr. A total of 149.7 mL of each precursor is delivered while the temperature of the reactor is maintained between 215-240° C. At the end of the infusion, the reaction vessel is cooled using room temperature airflow over a period of 5-15 min. The final material is used as is without further purification (First absorbance peak: 576 nm, total volume: 736.5 mL, Reaction yield: 99%). The absorption spectrum of the core is shown in FIG. 9A.

Example 11B

Figure 9B:
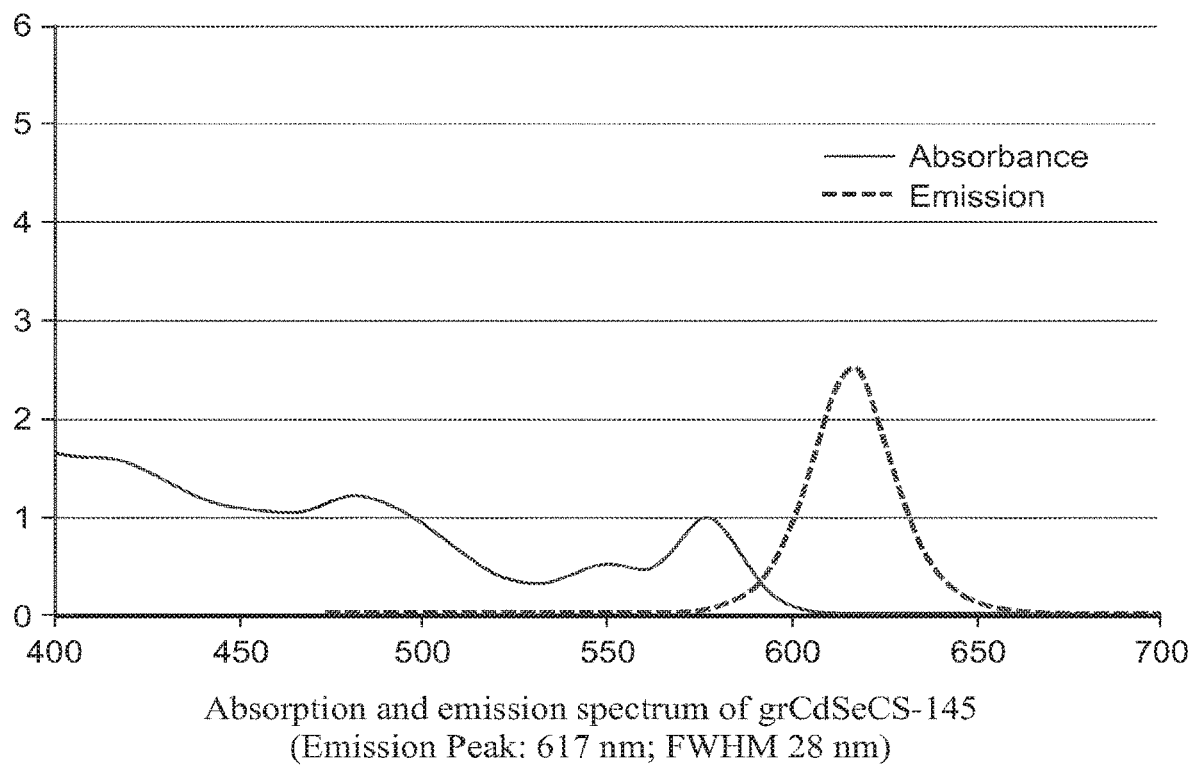

Synthesis of CdSe/ZnS/CdZnS Core/Shell/Shell:

CdSe cores synthesized as described in the preceding paragraph, with a first absorbance peak of 576 nm (90.10 mL, 8.70 mmol Cd), are mixed with Zn(Oleate)$_2$ (47.62 mL, 0.5M in TOP, 23.81 mmol). The solution is heated to 320° C., upon which a syringe containing 1-dodecanethiol (8.55 mL, 35.7 mmol) is swiftly injected. After 10 min of annealing between 305-325° C., the overcoat precursors are delivered via a syringe pump over a period of 30 min. The two overcoating precursor stocks include the following: 1) Zn(Oleate)$_2$ (89.73 mL, 0.5M in TOP, 44.87 mmol) mixed with Cd(Oleate)$_2$ (104.68 mL, 1.0M in TOP, 104.68 mmol), and 2) dodecanethiol (70.59 mL, 294.70 mmol) mixed with 1-octadecene (21.29 mL) and TOP (5.32 mL). During the overcoating precursor infusion, the temperature is kept between 320-330° C. Any volatiles from the system are allowed to distill over and leave the system in order for the temperature to reach 320-330° C. After the infusion ends, the sample is annealed for 5 min at 320-330° C. and cooled to room temperature over a period of 5-15 min. The final core/shell material is precipitated via the addition of butanol and methanol at a 2:1 ratio v/v. The pellet is isolated via centrifugation, and redispersed into toluene (200 mL) for storage (Emission 617 nm, FWHM 30 nm, Film EQE at RT: 92%, Film EQE at 140° C.: 75-80%). Absorption and emission spectra of the resulting overcoated nanocrystals are shown in FIG. 9B.

The EQE values presented in the above Examples and related figures for temperatures other than room temperature are relative values that are calculated based on the integrated PL change with temperature and correlated back to the RT EQE. The integrated PL at RT is set equal to the RT measured EQE and therefore any change in PL is then an equivalent % change in EQE with adjustment for any absorption change at elevated temperatures.

Semiconductor nanocrystals, compositions, optical components, devices, and other products described herein may be incorporated into a wide variety of other consumer products, including flat panel displays, computer monitors, all-in-one computers, notebooks, tablets, televisions, billboards, lights for interior or exterior illumination and/or signaling, heads up displays, fully transparent displays, flexible displays, laser printers, telephones, cell phones, smartphones, personal digital assistants (PDAs), laptop computers, digital cameras, camcorders, viewfinders, microdisplays, vehicles, a large area wall, theater or stadium screen, a sign, lamps and various solid state lighting devices.

Semiconductors described herein can be excited optically and the optical excitation is downconverted via emission from the semiconductor nanocrystals. Such photoluminescence is useful in any device/system where a LED light source is used (e.g. solid-state lighting, LED Backlights (LED-BLU) Liquid Crystal Displays (LCD)). Such photoluminescence can also be useful any device/system where a light source is downconverted to other wavelengths (e.g. solar concentrators or downconverters where sunlight is converted to specific wavelengths tuned to highest efficiency window of the solar cells used in the system; plasma based systems where high energy plasma emission can excite a semiconductor nanocrystal "phosphor"/downconverter, Taggants; bio-labeling or imaging; barcoding or security/covert labeling applications).

Semiconductor nanocrystals described herein can also be excited electrically and the excitation results in emission from the semiconductor nanocrystals. This process can involve: direct charge injection into the semiconductor nanocrystals generating semiconductor nanocrystal excited states and subsequent semiconductor nanocrystal emission, or energy transfer from other semiconductor materials, for example, within a device, to the semiconductor nanocrystals, generating an excited state and subsequent semiconductor nanocrystal emission.

Semiconductor nanocrystals, compositions, optical components, and other products described herein can also be useful in applications such as, for example, photovoltaic (PV) applications in which the semiconductor nanocrystal materials are excited optically and the excitation results in current generation and/or a voltage due to carrier extraction from the semiconductor nanocrystals.

Additional information that may be useful in connection with the present invention and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods"; International Application No. PCT/US2010/32859 of Modi et al, filed 28 Apr. 2010 entitled "Optical Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2011/047284 of Sadasivan et al, filed 10 Aug. 2011 entitled "Quantum Dot Based Lighting"; International Application No. PCT/US2008/007901 of Linton et al, filed 25 Jun. 2008 entitled "Compositions And Methods Including Depositing Nanomaterial"; U.S. patent application Ser. No. 12/283,609 of Coe-Sullivan et al, filed 12 Sep. 2008 entitled "Compositions, Optical Component, System Including An Optical Component, Devices, And Other Products"; International Application No. PCT/US2008/10651 of Breen et al, filed 12 Sep. 2008 entitled "Functionalized Nanoparticles And Method"; International Application No. PCT/US2009/004345 of Breen et al, filed 28 Jul. 2009 entitled "Nanoparticle Including Multi-Functional Ligand And Method", U.S. Patent Application No. 61/234,179 of Linton et al. filed 14 Aug. 2009 entitled "Lighting Devices, An Optical Component For A Lighting Device, And Methods"; U.S. Patent Application No. 61/252,743 of Linton et al filed 19 Oct. 2009 entitled "An Optical Component, Products Including Same, And Methods For Making Same"; U.S. Patent Application No. 61/291,072 of Linton et al filed 30 Dec. 2009 entitled "An Optical Component, Products Including Same, And Methods For Making Same"; International Application No. PCT/US2007/024320 of Clough et al, filed 21 Nov. 2007, entitled "Nanocrystals Including A Group IIIa Element And A Group Va Element, Method, Composition, Device And Other Products"; U.S. Pat. No. 6,600,175 of Baretz, et al., issued Jul. 29, 2003, entitled "Solid State White Light Emitter And Display Using Same"; U.S. Pat. No. 6,608,332 of Shimizu, et al., issued Aug. 19, 2003, entitled "Light Emitting Device and Display", and U.S. patent application Ser. No. 13/206,443 of Sadasivan et al. filed 9 Aug. 2011 entitled "Quantum Dot Based Lighting"; each of the foregoing being hereby incorporated herein by reference in its entirety.

As used herein, the singular forms "a", "an" and "the" include plural unless the context clearly dictates otherwise. Thus, for example, reference to a light emitting material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A semiconductor nanocrystal, which comprises: a core comprising a first semiconductor material and a first shell surrounding the core, wherein the first shell comprises a second semiconductor material and is disposed directly on the core,
    wherein the nanocrystal further includes a second shell surrounding the outer surface thereof and the second shell comprises a third semiconductor material, where the third semiconductor material comprises a ternary mixture; and
    wherein the semiconductor nanocrystal further includes a third shell, wherein the third shell has a bandgap that is the same as that of the first shell and the second shell has a bandgap that is less than that of the first shell.

2. A semiconductor nanocrystal in accordance with claim 1 wherein the first shell has a thickness greater than or equal to the thickness of 1 monolayer of the second semiconductor material.

3. A semiconductor nanocrystal in accordance with claim 2 wherein the first shell has a thickness up to the thickness of about 10 monolayers of the second semiconductor material.

4. A semiconductor nanocrystal in accordance with claim 1 wherein the second shell has a thickness greater than or equal to the thickness of 3 monolayers of the third semiconductor material.

5. A semiconductor nanocrystal in accordance with claim 4 wherein the second shell has a thickness up to the thickness of about 20 monolayers of the third semiconductor material.

6. A semiconductor nanocrystal in accordance with claim 1 wherein the first shell comprises zinc sulfide, and the second shell comprises one or more metals wherein the one or metals comprises from 0 to less than 100% cadmium.

7. A semiconductor nanocrystal in accordance with claim 1 wherein the core comprises CdSe, the first shell comprises ZnS at a thickness of about 3-4 monolayers of ZnS, and the second shell comprises $Cd_{1-x}Zn_xS$ wherein $0<x<1$ at a thickness of about 9-10 monolayers of $Cd_{1-x}Zn_xS$.

8. A semiconductor nanocrystal in accordance with claim 1 wherein the first shell comprises a thickness of about 3-4 monolayers of ZnS.

9. A semiconductor nanocrystal in accordance with claim 1 wherein the second shell has a thickness of about 9-10 monolayers.

10. A semiconductor nanocrystal in accordance with claim 1 wherein the first shell comprises Zn and S.

11. A semiconductor nanocrystal in accordance with claim 1 wherein first shell has a bandgap which is greater than that of the second shell.

12. A semiconductor nanocrystal in accordance with claim 1 wherein the first shell has a bandgap which is greater than that of the second shell, and the bandgap of the first shell is also greater than that of the core.

13. A semiconductor nanocrystal in accordance with claim 1 wherein the first semiconductor material has a bandgap which differs from that of the second semiconductor material by at least 0.8 eV.

14. A light-emitting device comprising a light-emitting element and an optical material arranged to receive and convert at least a portion of light emitted by at least a portion of the light-emitting element from a first emission wavelength to one or more predetermined wavelengths, wherein the material comprises a semiconductor nanocrystal in accordance with claim 1.

\* \* \* \* \*